United States Patent
Motohashi et al.

(10) Patent No.: US 10,627,884 B2
(45) Date of Patent: Apr. 21, 2020

(54) SEMICONDUCTOR DEVICE, POWER-SUPPLY SYSTEM, AND CONTROLLING METHOD OF SEMICONDUCTOR DEVICE

(71) Applicant: Renesas Electronics Corporation, Tokyo (JP)

(72) Inventors: Masataka Motohashi, Tokyo (JP); Yosuke Watanabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 73 days.

(21) Appl. No.: 16/029,348

(22) Filed: Jul. 6, 2018

(65) Prior Publication Data

US 2019/0064904 A1   Feb. 28, 2019

(30) Foreign Application Priority Data

Aug. 24, 2017  (JP) .................................. 2017-161318

(51) Int. Cl.
*H02M 1/32*      (2007.01)
*H02M 1/36*      (2007.01)
(Continued)

(52) U.S. Cl.
CPC ............... *G06F 1/305* (2013.01); *G06F 1/30* (2013.01); *H02J 9/06* (2013.01); *H02M 1/32* (2013.01);
(Continued)

(58) Field of Classification Search
CPC .. H02J 9/06; H02J 9/061; H02M 1/32; H02M 1/36; G06F 1/305
(Continued)

(56) References Cited

U.S. PATENT DOCUMENTS 4,757,505 A   7/1988  Marrington et al.
4,788,449 A   11/1988 Katz
(Continued)

FOREIGN PATENT DOCUMENTS

JP      2009-055686 A    3/2009

OTHER PUBLICATIONS

Texas Instruments: "N+1 and ORing Power Rail Controller with Enable," Sep. 30, 2011 (Sep. 30, 2011), XP055554254, Retrieved from the Internet: URL: http://www.ti.com/lit/ds/symlink/tps2419.pdf [retrieved on Feb. 8, 2019].
(Continued)

*Primary Examiner* — Adolf D Berhane
*Assistant Examiner* — Nusrat Quddus
(74) *Attorney, Agent, or Firm* — McDermott Will & Emery LLP

(57) ABSTRACT

To safely stop a system even when an abnormality occurs in a power supply for a control circuit, a semiconductor device includes a control circuit, a first power supply that outputs a first voltage to be supplied to the control circuit as a power-supply voltage, a first voltage monitoring circuit that determines whether the first voltage is abnormal, a first switch that is coupled to the first power supply and the control circuit, and cuts off supply of the first voltage to the control circuit when it is determined that the first voltage is abnormal, and a power-supply switching circuit that is coupled to the control circuit and a second power supply, which outputs a second voltage to be supplied to a circuit to which power supply is supplied other than the control circuit as a power-supply voltage, and supplies the second voltage to the control circuit in a state where the supply of the first voltage to the control circuit is cut off.

20 Claims, 18 Drawing Sheets

(51) Int. Cl.
*G06F 1/30* (2006.01)
*H02J 9/06* (2006.01)
*H02M 1/00* (2006.01)

(52) U.S. Cl.
CPC ...... *H02M 1/36* (2013.01); *H02M 2001/0006* (2013.01); *H02M 2001/325* (2013.01); *H03K 2217/0081* (2013.01)

(58) Field of Classification Search
USPC ................................ 323/234, 282–289, 315
See application file for complete search history.

(56) References Cited

U.S. PATENT DOCUMENTS

| | | | | |
|---|---|---|---|---|
| 6,016,072 A | * | 1/2000 | Ternullo, Jr. | ............ H02M 3/07 323/284 |
| 6,205,079 B1 | * | 3/2001 | Namekawa | ............ G11C 5/143 327/536 |
| 6,614,671 B2 | * | 9/2003 | Thrap | ............ H02J 1/102 307/64 |
| 2011/0054742 A1 | * | 3/2011 | Yamashita | ............ B62D 5/0463 701/43 |
| 2013/0057230 A1 | * | 3/2013 | Lim | ............ H02M 1/4225 323/209 |
| 2016/0062383 A1 | * | 3/2016 | Nagasawa | ............ G05F 3/24 307/130 |
| 2017/0346479 A1 | * | 11/2017 | Tsai | ............ H03K 17/08142 |

OTHER PUBLICATIONS

Extended European Search Report dated Feb. 27, 2019 for European Patent Application No. 18183463.1-1201.

* cited by examiner

SEMICONDUCTOR DEVICE, POWER-SUPPLY SYSTEM, AND CONTROLLING METHOD OF SEMICONDUCTOR DEVICE

CROSS-REFERENCE TO RELATED APPLICATIONS

The disclosure of Japanese Patent Application No. 2017-161318 filed on Aug. 24, 2017 including the specification, drawings and abstract is incorporated herein by reference in its entirety.

BACKGROUND

The present invention relates to a semiconductor device, and more particularly relates to a semiconductor device that uses a redundant power supply, for example.

A semiconductor device such as a system LSI (Large Scale Integrated circuit) executes a stop sequence for safely stopping the whole of a system including the semiconductor device under control of a control circuit, in a case where an abnormality, such as voltage drop, occurs in an output voltage of a power supply.

However, if an output voltage of a regular power supply that supplies a power-supply voltage to the control circuit becomes abnormal and the power-supply voltage cannot be supplied from the regular power supply to the control circuit, the control circuit cannot execute the stop sequence, so that an analog circuit inside the semiconductor device may be damaged, for example. In addition, if the power-supply voltage cannot be supplied from the regular power supply to the control circuit, it is likely that an unintended signal is transmitted from the control circuit to the inside or outside of the semiconductor device, leading to a malfunction of the system, for example.

Therefore, a technique for supplying the power-supply voltage to the control circuit stably has been proposed. According to Japanese Unexamined Patent Application Publication No. 2009-055686, for example, at least one spare power supply is provided in addition to a currently used power supply, and an output voltage of the currently used power supply is monitored. When the output voltage of the currently used power supply drops to a threshold value or lower, an operation for starting up the spare power supply that is stopping is performed and, on condition that start-up of the spare power supply is completed, a power-supply switching operation that makes the spare power supply a new currently used power supply is performed.

SUMMARY

However, the technique disclosed in Japanese Unexamined Patent Application Publication No. 2009-055686 requires a spare power supply in addition to a currently used power supply, and therefore an area impact is large.

Other objects and novel features will be apparent from the description of this specification and the accompanying drawings.

According to an embodiment, when a first voltage that is output from a first power supply and is supplied to a control circuit as a power-supply voltage is determined to be abnormal, supply of the first voltage to the control circuit is cut off. In a state where supply of the first voltage to the control circuit is cut off, a second voltage is supplied to the control circuit, the second voltage being output from a second power supply and being supplied to a circuit to which power supply is supplied other than the control circuit as a power-supply voltage.

According to the aforementioned embodiment, it is possible to contribute to solution of the above-described problem.

DETAILED DESCRIPTION

Embodiments are described below. For clarifying explanation, omission and simplification are made in the following description and the drawings as appropriate. Throughout the drawings, the same component is labeled with the same reference sign, and redundant description thereof is omitted as necessary.

(1) First Embodiment

<Configuration of First Embodiment>

Figure 1:
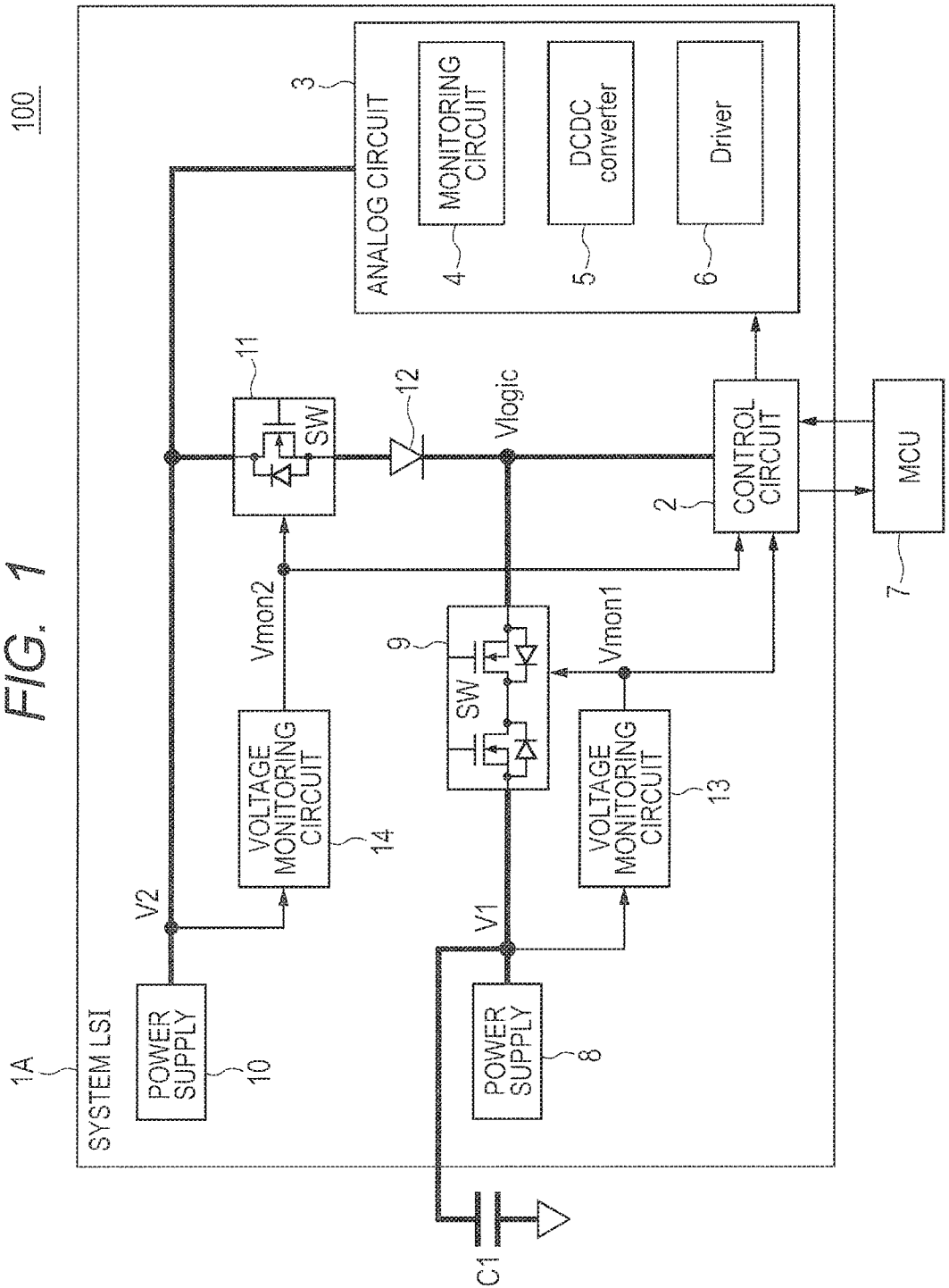
FIG. 1 is a circuit diagram of a configuration example of a power-supply system 100 according to a first embodiment.

First, referring to FIG. 1, a configuration of a power-supply system 100 according to this first embodiment is described. FIG. 1 is a circuit diagram illustrating a configuration example of the power-supply system 100 according to this first embodiment.

As illustrated in FIG. 1, the power-supply system 100 according to this first embodiment includes a system LSI 1A, an MCU (Micro Controller Unit) 7, and the like. The system LSI 1A corresponds to a semiconductor device according to this first embodiment. The system LSI 1A includes a control circuit 2, an analog circuit (a circuit to which power supply is supplied) 3, a power supply (a first power supply) 8, a voltage monitoring circuit (a first voltage monitoring circuit) 13, a SW (a first switch) 9, a power supply (a second power supply) 10, a voltage monitoring circuit (a second voltage monitoring circuit) 14, a SW (a second switch) 11, and a diode 12.

The control circuit 2 controls an operation of the analog circuit 3, and communicates with the MCU 7 to transmit an abnormality inside and outside the system LSI 1A to the MCU 7.

The power supply 8 is a regular power supply for the control circuit 2, which outputs a voltage V1 that is to be supplied to the control circuit 2 as a power-supply voltage Vlogic. The power supply 8 is coupled to the control circuit 2 via the SW 9. Therefore, the output voltage V1 of the power supply 8 is supplied to the control circuit 2 via the SW 9.

The voltage monitoring circuit 13 monitors the output voltage V1 of the power supply 8, and outputs a detection signal Vmon1 indicating a result of that monitoring to the SW 9 and the control circuit 2. Upon detecting an abnormality (voltage drop or rise) of the output voltage V1 of the power supply 8, the voltage monitoring circuit 13 switches the detection signal Vmon1 from L to H.

When the detection signal Vmon1 output from the voltage monitoring circuit 13 is switched from L to H, the SW 9 is turned off and cuts off supply of the output voltage V1 of the power supply 8 to the control circuit 2.

The analog circuit 3 includes a monitoring circuit 4 that monitors a voltage, a current, and a temperature, for example, a DCDC converter 5 that converts a power-supply voltage supplied from the power supply 10 to various voltages, and a driver 6 that drives various actuators, and the like.

The power supply 10 is a power supply for the analog circuit 3, which outputs a voltage V2 that is supplied to the analog circuit 3 as a power-supply voltage. The power supply 10 is directly coupled to the analog circuit 3. Therefore, the output voltage V2 of the power supply 10 is directly supplied to the analog circuit 3.

The power supply 10 is also coupled to the control circuit 2 via the SW 11 and the diode 12. In more detail, the SW 11 is coupled to the power supply 10, a cathode of the diode 12 is coupled to the control circuit 2, and an anode of the diode 12 and the SW 11 are coupled to each other. Therefore, the output voltage V2 of the power supply 10 can be also supplied to the control circuit 2 via the SW 11 and the diode 12. Accordingly, the power supply 10 also serves as a redundant power supply for the control circuit 2.

The voltage monitoring circuit 14 monitors the output voltage V2 of the power supply 10, and outputs a detection signal Vmon2 indicating a result of that monitoring to the SW 11 and the control circuit 2. Upon detecting an abnormality (voltage drop or rise) of the output voltage V2 of the power supply 10, the voltage monitoring circuit 14 switches the detection signal Vmon2 from L to H.

When the detection signal Vmon2 output from the voltage monitoring circuit 14 is switched from L to H, the SW 11 is turned off and cuts off supply of the output voltage V2 of the power supply 10 to the control circuit 2.

The diode 12 is a diode of which a forward voltage is Vf.

The SW 11 and the diode 12 constitute a power-supply switching circuit. In a state where supply of the output voltage V1 of the power supply 8 to the control circuit 2 is cut off by the SW 9, this power-supply switching circuit supplies the output voltage V2 of the power supply 10 to the control circuit 2. A voltage supplied as the power-supply voltage Vlogic to the control circuit 2 via this power-supply switching circuit is V2−Vf that is lower than the output voltage V2 of the power supply 10 by the forward voltage Vf of the diode 12.

A timing at which the power-supply switching circuit starts supply of the output voltage V2 of the power supply 10 to the control circuit 2 is not necessarily coincident with a timing at which supply of the output voltage V1 of the power supply 8 to the control circuit 2 is cut off by the SW 9, and can be prior to the cut-off timing. That is, it suffices that the power-supply switching circuit is configured to supply the output voltage V2 of the power supply 10 to the control circuit 2 after supply of the output voltage V1 of the power supply 8 to the control circuit 2 is cut off by the SW 9.

As described above, to the control circuit 2, the output voltage V1 of the power supply 8 is supplied as the power-supply voltage Vlogic when the output voltage V1 is normal, and the output voltage V2 of the power supply 10 is supplied as the power-supply voltage Vlogic when an abnormality occurs in the output voltage V1 of the power supply 8. Therefore, even when an abnormality occurs in the output voltage V1 of the power supply 8, the control circuit 2 can maintain a normal operation.

The output voltage V2 of the power supply 10 is a voltage that is approximately the same as the output voltage V1 of the power supply 8, and it suffices that a voltage value of V2−Vf actually supplied to the control circuit 2 is equal to or larger than a voltage value at which the control circuit 2 can normally operate.

<Operations in First Embodiment>

As operations of the system LSI 1A according to this first embodiment, operations in a case where an abnormality occurs in the output voltage V1 of the power supply 8 and the output voltage V2 of the power supply 10 are described below. The following description is provided assuming that both the output voltage V1 of the power supply 8 and the output voltage V2 of the power supply 10 are 3.3 V normally.

<Operation in a Case where Output Voltage V1 of Power Supply 8 Drops>

First, an operation example in a case where the output voltage V1 of the power supply 8 drops is described. Because the operation in the case where the output voltage V1 of the power supply 8 drops is different depending on the magnitude relation between a lower limit threshold value Vth1 of the output voltage V1 and V2−f. Therefore, the operation is described for each case below.

<Operation in a Case where Output Voltage V1 of Power Supply 8 Drops (Vth1 V2−Vf)>

Figure 2:
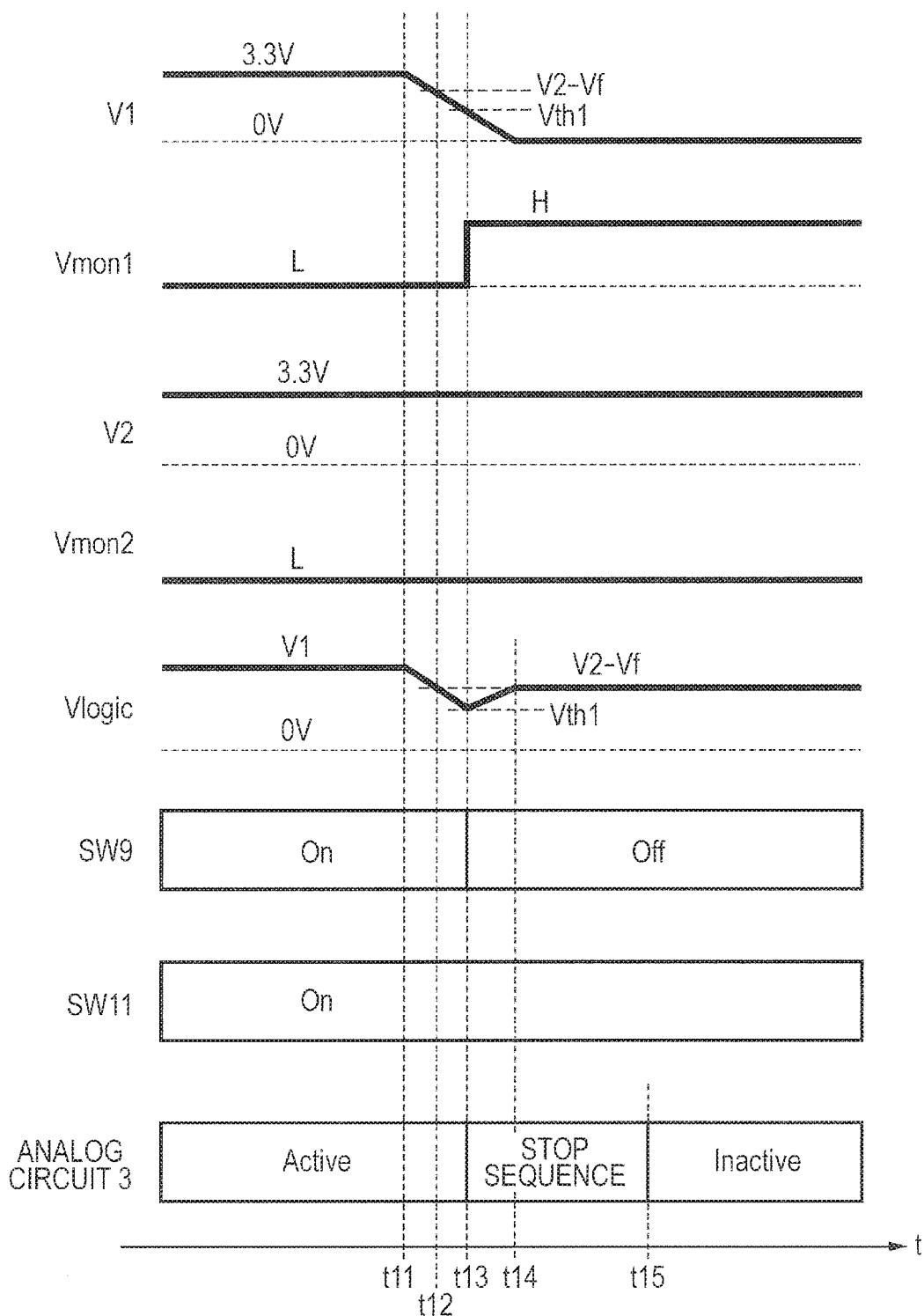
FIG. 2 is a timing chart illustrating an operation example of a system LSI 1A according to the first embodiment in a case where an output voltage V1 of a power supply 8 drops.

First, referring to FIG. 2, an operation example is described in a case where the output voltage V1 of the power supply 8 drops in a state where Vth1≤V2−Vf is set. FIG. 2 is a timing chart illustrating an operation example of the system LSI 1A according to the first embodiment in a case where the output voltage V1 of the power supply 8 drops in the state where Vth1≤V2−Vf is set. It is assumed here that the output voltage V1 of the power supply 8 gradually drops from 3.3 V to 0 V.

As illustrated in FIG. 2, in an initial state, both the output voltage V1 of the power supply 8 and the output voltage V2 of the power supply 10 are 3.3 V, that is, are normal. Therefore, the output voltage V1 of the power supply 8, which is 3.3 V, is supplied to the control circuit 2 as the power-supply voltage Vlogic. Further, the analog circuit 3 in the system LSI 1A is active (Active).

At a time t11, when the output voltage V1 of the power supply 8 drops from 3.3 V, the power-supply voltage Vlogic supplied to the control circuit 2 also drops.

At a time t12, when the output voltage V1 of the power supply 8 drops to V2−Vf, which is lower than the output voltage V2 of the power supply 10 by the forward voltage Vf of the diode 12, or lower, the output voltage V2 of the power supply 10 is also supplied to the control circuit 2. Therefore, from the time t12 to a time t13, both the output voltage V1 of the power supply 8 and the output voltage V2 of the power supply 10 are supplied to the control circuit 2 as the power-supply voltage Vlogic.

At the time t13, when the output voltage V1 of the power supply 8 drops to the lower limit threshold value Vth1 of V1 or lower, the voltage monitoring circuit 13 detects the voltage drop of V1 and switches the detection signal Vmon1 from L to H. In response to this switching, the SW 9 is turned off, so that supply of the output voltage V1 of the power supply 8 to the control circuit 2 is cut off. Therefore, after the time t13, only the output voltage V2 of the power supply 10 is supplied to the control circuit 2.

After the time t13, the power-supply voltage Vlogic supplied to the control circuit 2 gradually rises, and reaches V2−Vf at a time t14 after a delay time caused a capacitance component (not illustrated) coupled to an input stage of the control circuit 2. Therefore, the control circuit 2 can maintain a normal operation.

Further, at the time t13, when the voltage monitoring circuit 13 switches the detection signal Vmon1 from L to H, the control circuit 2 enters a stop sequence that safely stops the analog circuit 3 in the system LSI 1A in response to this switching. At a time t15, when the stop sequence is ended, the analog circuit 3 becomes inactive (Inactive).

Furthermore, at the time t13, the control circuit 2 outputs an error flag (an error signal) to the MCU 7 provided outside the system LSI 1A. In response to this output, the MCU 7 also enters the stop sequence. Therefore, it is possible to safely stop the entire power-supply system 100.

<Operation in a Case where Output Voltage V1 of Power Supply 8 Drops (Vth1>V2−Vf)>

Figure 3:
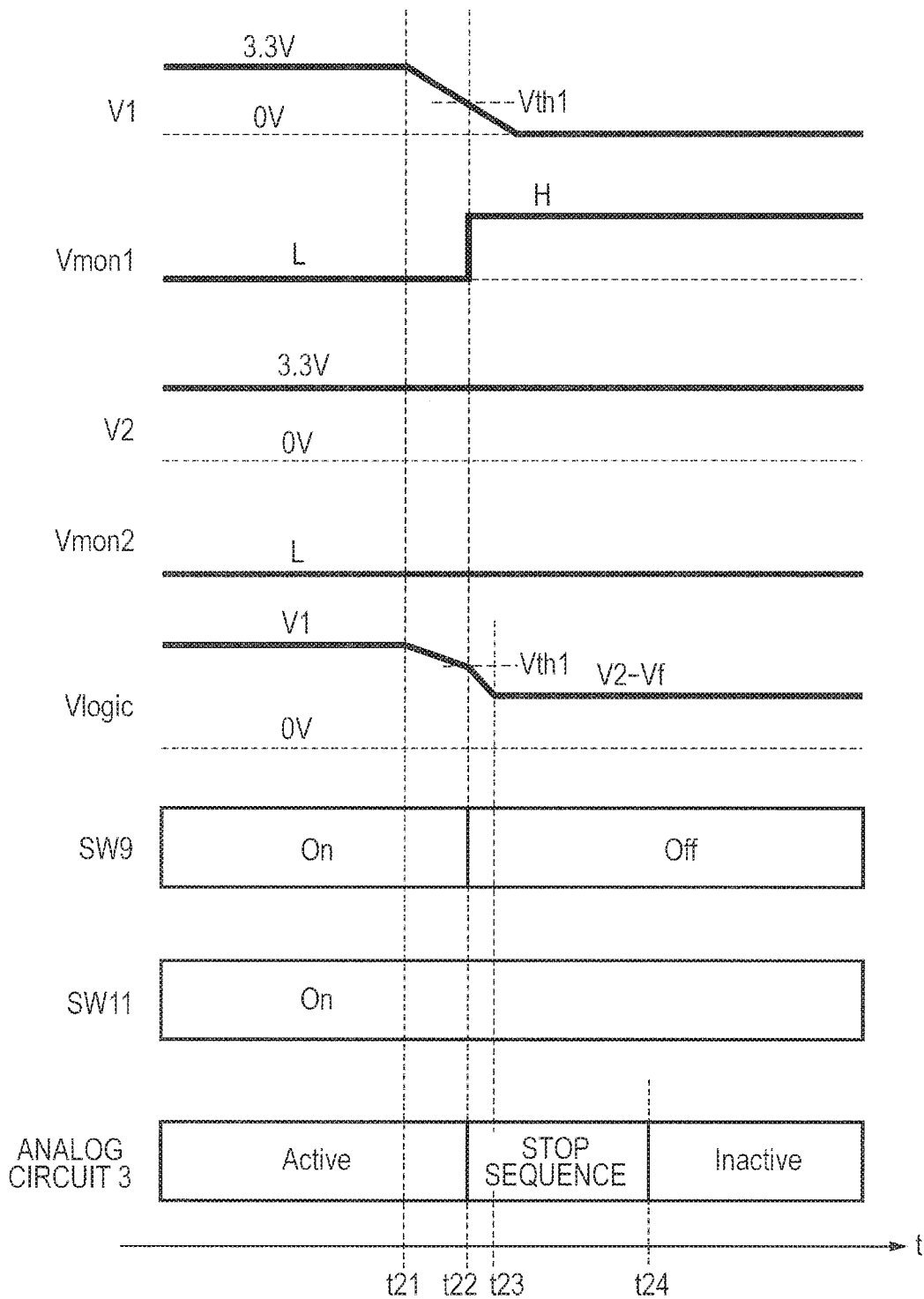
FIG. 3 is a timing chart illustrating an operation example of the system LSI 1A according to the first embodiment in a case where the output voltage V1 of the power supply 8 drops.

Subsequently, referring to FIG. 3, an operation example is described in a case where the output voltage V1 of the power supply 8 drops in a state where Vth1>V2−Vf is set. FIG. 3 is a timing chart illustrating an operation example of the system LSI 1A according to this first embodiment in a case where the output voltage V1 of the power supply 8 drops in the state where Vth1>V2−Vf is set. It is assumed here that the output voltage V1 of the power supply 8 gradually drops from 3.3 V to 0 V.

As illustrated in FIG. 3, the initial state is the same as that in FIG. 2.

At a time t21, when the output voltage V1 of the power supply 8 drops from 3.3 V, the power-supply voltage Vlogic supplied to the control circuit 2 also drops.

At a time t22, when the output voltage V1 of the power supply 8 drops to the lower limit threshold value Vth1 of V1 or lower, the voltage monitoring circuit 13 detects the voltage drop of V1 and switches the detection signal Vmon1 from L to H. In response to this switching, the SW 9 is turned off, so that supply of the output voltage V1 of the power supply 8 to the control circuit 2 is cut off. Therefore, after the time t22, the output voltage V2 of the power supply 10 is supplied to the control circuit 2.

After the time t22, the power-supply voltage Vlogic supplied to the control circuit 2 gradually drops, and reaches V2−Vf at a time t23 after a delay time caused by a capacitance component (not illustrated) coupled to an input stage of the control circuit 2. Therefore, the control circuit 2 can maintain a normal operation.

Further, at the time t22, when the voltage monitoring circuit 13 switches the detection signal Vmon1 from L to H, the control circuit 2 enters a stop sequence that safely stops the analog circuit 3 in the system LSI 1A in response to this switching. At a time t24, when the stop sequence is ended, the analog circuit 3 becomes inactive.

Furthermore, at the time t22, the control circuit 2 outputs an error flag (an error signal) to the MCU 7 provided outside the system LSI 1A. In response to this output, the MCU 7 also enters the stop sequence. Therefore, it is possible to safely stop the entire power-supply system 100.

<Operation in a Case where Output Voltage V1 of Power Supply 8 Rises>

Figure 4:
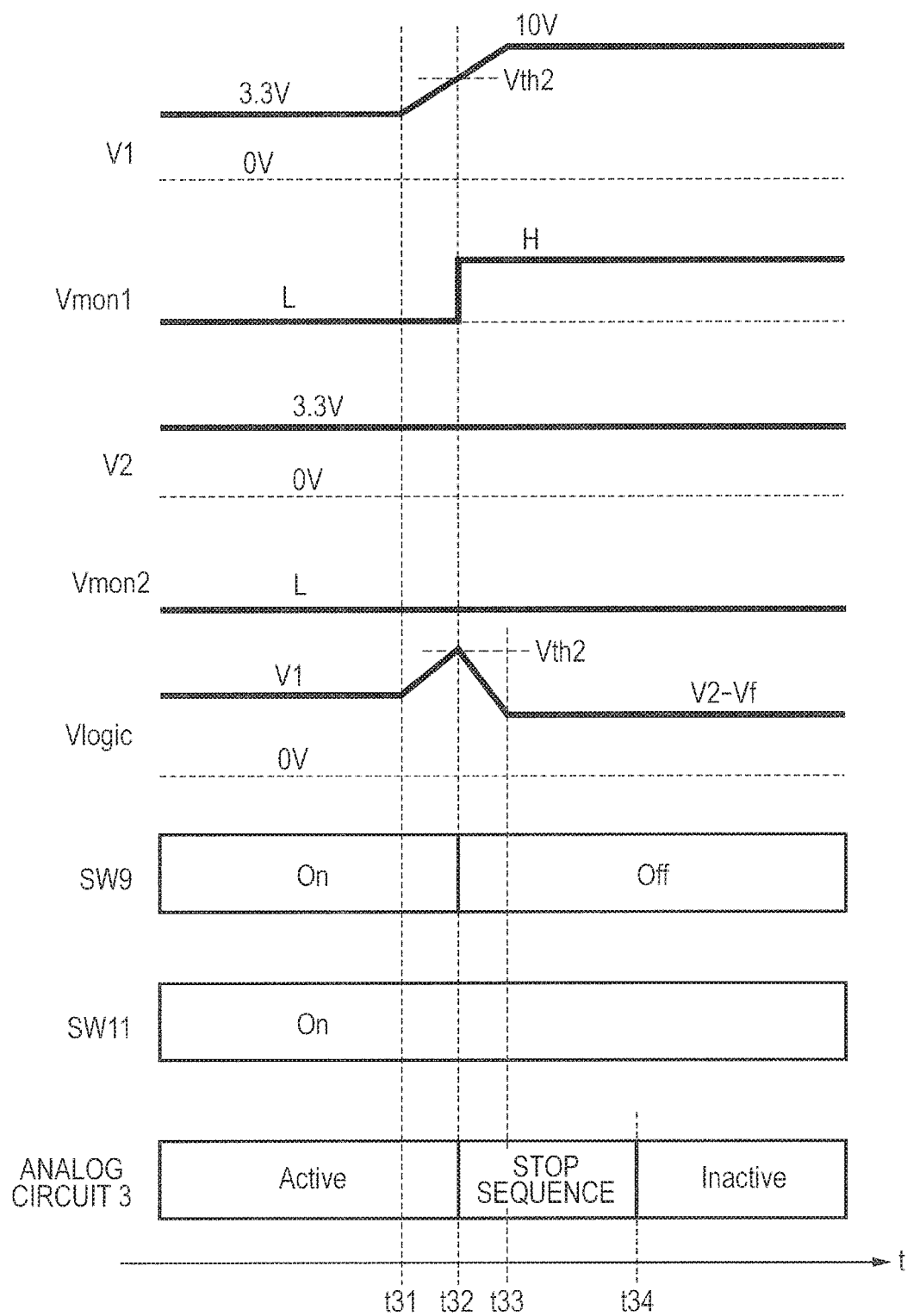
FIG. 4 is a timing chart illustrating an operation example of the system LSI 1A according to the first embodiment in a case where the output voltage V1 of the power supply 8 rises.

Subsequently, referring to FIG. 4, an operation example in a case where the output voltage V1 of the power supply 8 rises is described. FIG. 4 is a timing chart illustrating an operation example of the system LSI 1A according to this first embodiment in a case where the output voltage V1 of the power supply 8 rises. It is assumed here that the output voltage V1 of the power supply 8 gradually rises from 3.3 V to 10 V. Further, an upper limit threshold value Vth2 of the output voltage V1 of the power supply 8 is any value at which the control circuit 2 is not broken.

As illustrated in FIG. 4, the initial state is the same as that in FIG. 2.

At a time t31, when the output voltage V1 of the power supply 8 rises from 3.3 V, the power-supply voltage Vlogic supplied to the control circuit 2 also rises.

At a time t32, when the output voltage V1 of the power supply 8 rises to the upper limit threshold value Vth2 of V1 or higher, the voltage monitoring circuit 13 detects the voltage rise of V1 and switches the detection signal Vmon1 from L to H. In response to this switching, the SW 9 is turned off, so that supply of the output voltage V1 of the power supply 8 to the control circuit 2 is cut off. Therefore, after the time t32, the output voltage V2 of the power supply 10 is supplied to the control circuit 2.

After the time t32, the power-supply voltage Vlogic supplied to the control circuit 2 gradually drops, and reaches V2−Vf at a time t33 after a delay time caused by a capacitance component (not illustrated) coupled to an input stage of the control circuit 2. Therefore, it is possible to maintain a normal operation of the control circuit 2 while protecting the control circuit 2 against overvoltage breakdown.

Further, at the time t32, when the voltage monitoring circuit 13 switches the detection signal Vmon1 from L to H, the control circuit 2 enters a stop sequence that safely stops the analog circuit 3 in the system LSI 1A in response to this switching. At a time t34, when the stop sequence is ended, the analog circuit 3 becomes inactive.

Furthermore, at the time t32, the control circuit 2 outputs an error flag (an error signal) to the MCU 7 provided outside the system LSI 1A. In response to this output, the MCU 7 also enters the stop sequence. Therefore, it is possible to safely stop the entire power-supply system 100.

<Operation in a Case where Output Voltage V2 of Power Supply 10 Rises>

Figure 5:
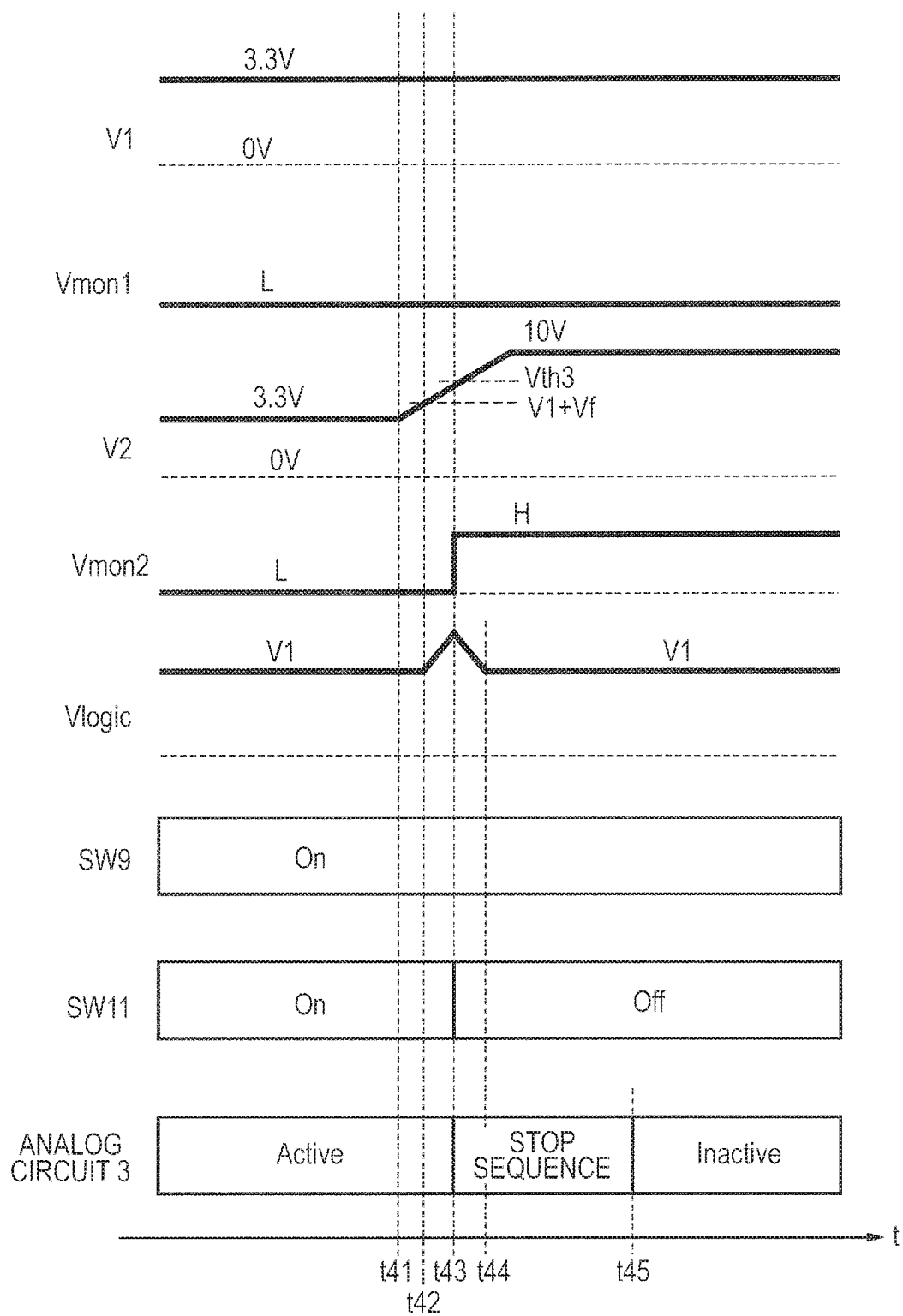
FIG. 5 is a timing chart illustrating an operation example of the system LSI 1A according to the first embodiment in a case where an output voltage V2 of a power supply 10 rises.

Subsequently, referring to FIG. 5, an operation example in a case where the output voltage V2 of the power supply 10 rises is described. FIG. 5 is a timing chart illustrating an operation example of the system LSI 1A according to this first embodiment in a case where the output voltage V2 of the power supply 10 rises. It is assumed here that the output voltage V2 of the power supply 10 gradually rises from 3.3 V to 10 V. An upper limit threshold value Vth3 of the output voltage V2 is determined by a set value of the voltage monitoring circuit 14 and is any value at which the analog circuit 3 and the control circuit 2 are not broken. Further, by setting the upper limit threshold value Vth3 of the voltage V2 to any voltage value higher than V1+Vf that is higher than the output voltage V1 of the power supply 8 by the forward voltage Vf of the diode 12, it is also possible to obtain an advantageous effect that power supply to the control circuit 2 from the power supply 10 can be achieved in a case where the output voltage V1 of the power supply 8 drops below a normal state. However, this first embodiment is not limited to a case where the upper limit threshold voltage Vth3 of the voltage V2 is higher than V1+Vf.

As illustrated in FIG. 5, the initial state is the same as that in FIG. 2.

At a time t41, the output voltage V2 of the power supply 10 rises from 3.3 V.

At a time t42, when the output voltage V2 of the power supply 10 rises to V1+Vf that is higher than the output voltage V1 of the power supply 8 by the forward voltage Vf of the diode 12 or higher, the output voltage V2 of the power supply 10 is also supplied to the control circuit 2. Therefore, from the time t42 to a time t43, both the output voltage V1 of the power supply 8 and the output voltage V2 of the power supply 10 are supplied to the control circuit 2 as the power-supply voltage Vlogic, so that the power-supply voltage Vlogic rises.

At the time t43, when the output voltage V2 of the power supply 10 rises to the upper limit threshold value Vth3 of V2 or higher, the voltage monitoring circuit 14 detects the voltage rise of V2 and switches the detection signal Vmon2 from L to H. In response to this switching, the SW 11 is turned off, so that supply of the output voltage V2 of the power supply 10 to the control circuit 2 is cut off. Therefore, after the time t43, only the output voltage V1 of the power supply 8 is supplied to the control circuit 2.

After the time t43, the power-supply voltage Vlogic supplied to the control circuit 2 gradually drops, and reaches V1 at a time t44 after a delay time caused by a capacitance component (not illustrated) coupled to an input stage of the control circuit 2. Therefore, it is possible to maintain a normal operation of the control circuit 2 while protecting the control circuit 2 against overvoltage breakdown.

Further, at the time t43, when the voltage monitoring circuit 14 switches the detection signal Vmon2 from L to H, the control circuit 2 enters a stop sequence that safely stops the analog circuit 3 in the system LSI 1A in response to this switching. At a time t45, when the stop sequence is ended, the analog circuit 3 becomes inactive.

Furthermore, at the time t43, the control circuit 2 outputs an error flag (an error signal) to the MCU 7 provided outside the system LSI 1A. In response to this output, the MCU 7 also enters the stop sequence. Therefore, it is possible to safely stop the entire power-supply system 100.

<Operation in a Case where Output Voltage V2 of Power Supply 10 Drops>

Figure 6:
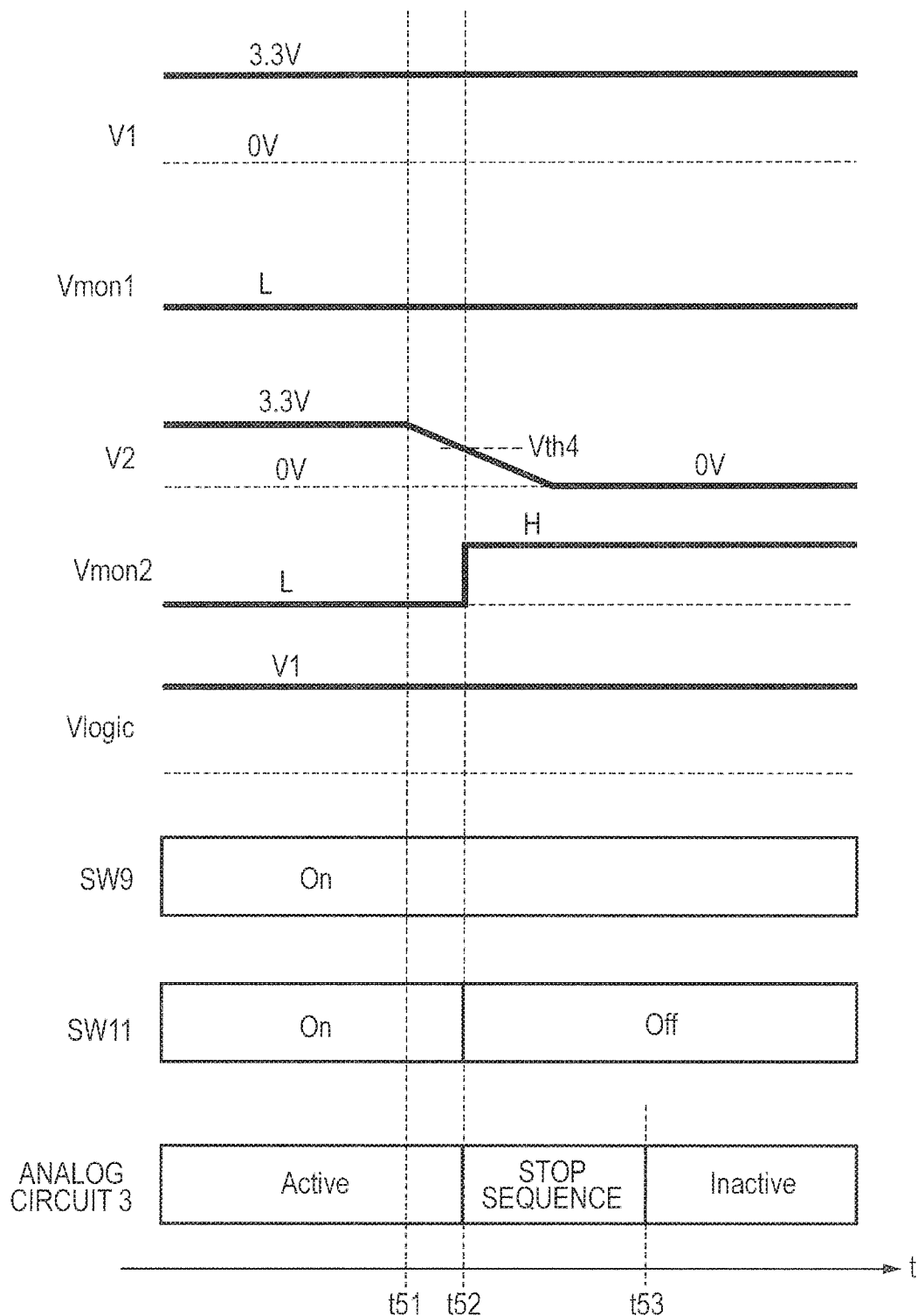
FIG. 6 is a timing chart illustrating an operation example of the system LSI 1A according to the first embodiment in a case where the output voltage V2 of the power supply 10 drops.

Subsequently, referring to FIG. 6, an operation example in a case where the output voltage V2 of the power supply 10 drops is described. FIG. 6 is a timing chart illustrating an operation example of the system LSI 1A according to the first embodiment in a case where the output voltage V2 of the power supply 10 drops. It is assumed here that the output voltage V2 of the power supply 10 gradually drops from 3.3 V to 0 V. Further, a lower limit threshold value Vth4 of the output voltage V2 of the power supply 10 is any value lower than 3.3 V.

As illustrated in FIG. 6, the initial state is the same as that in FIG. 2.

At a time t51, the output voltage V2 of the power supply 10 drops from 3.3 V.

At a time t52, when the output voltage V2 of the power supply 10 drops to the lower limit threshold value Vth4 of V2 or lower, the voltage monitoring circuit 14 detects the voltage drop of V2 and switches the detection signal Vmon2 from L to H. In response to this switching, the SW 11 is turned off, so that supply of the output voltage V2 of the power supply 10 to the control circuit 2 is cut off.

Therefore, also after the time t52, the voltage drop of the output voltage V2 of the power supply 10 is not propagated to the control circuit 2, and a state where the output voltage V1 of the power supply 8 is supplied to the control circuit 2 as the power-supply voltage Vlogic is maintained. Accordingly, it is possible to maintain a normal operation of the control circuit 2.

Further, at the time t52, when the voltage monitoring circuit 14 switches the detection signal Vmon2 from L to H, the control circuit 2 enters a stop sequence that safely stops the analog circuit 3 in the system LSI 1A in response to this switching. At a time t53, when the stop sequence is ended, the analog circuit 3 becomes inactive.

Further, at the time t52, the control circuit 2 outputs an error flag (an error signal) to the MCU 7 provided outside the system LSI 1A. In response to this output, the MCU 7 also enters the stop sequence. Therefore, it is possible to safely stop the entire power-supply system 100.

<Overall Operation Flow>

Figure 7:
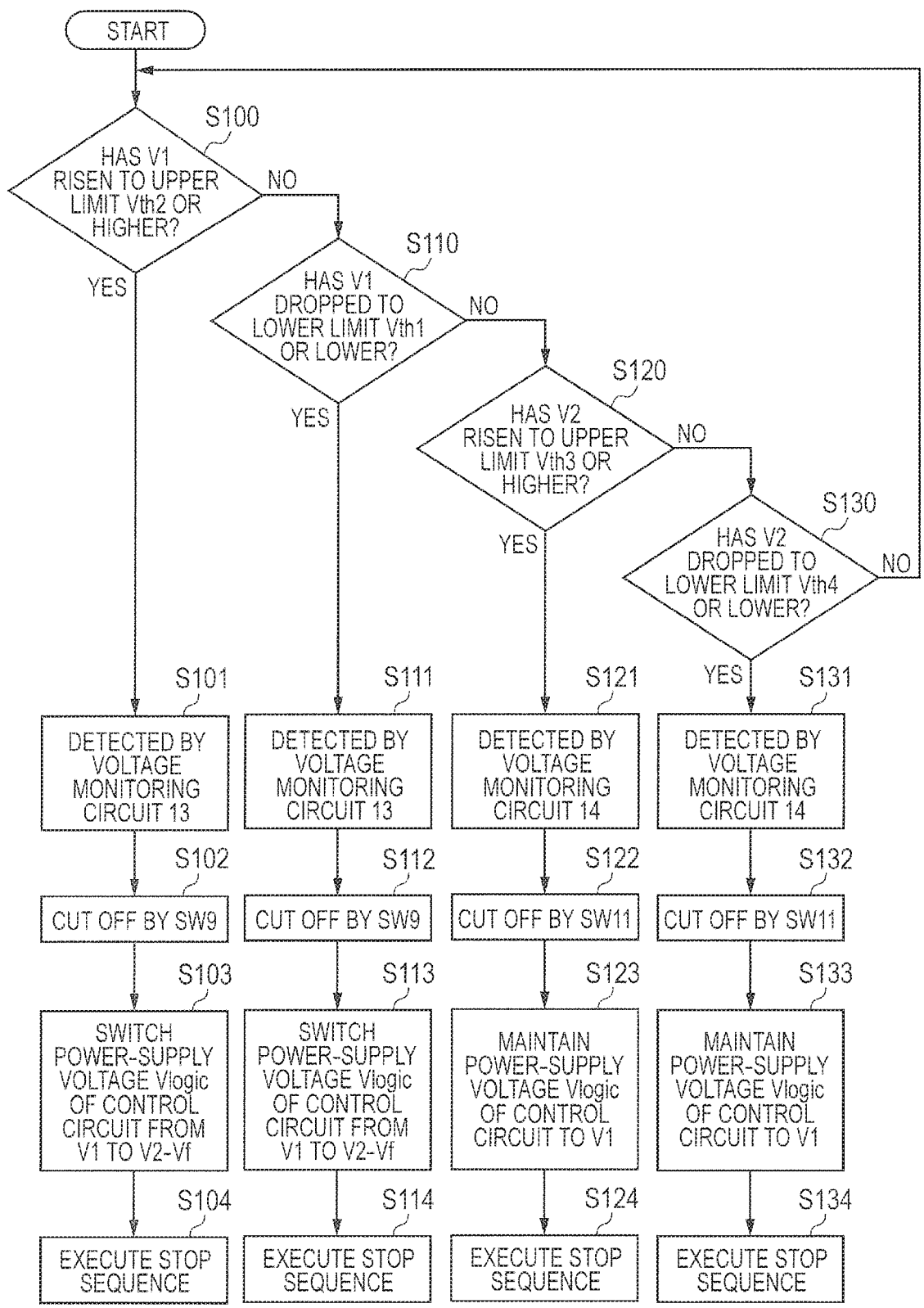
FIG. 7 is a flowchart of an example of an overall operation flow of the system LSI 1A according to the first embodiment.

Next, referring to FIG. 7, an example of an overall operation flow of the system LSI 1A according to this first embodiment is described. FIG. 7 is a flowchart of an example of an overall operation flow of the system LSI 1A according to the first embodiment.

As illustrated in FIG. 7, it is assumed that the output voltage V1 of the power supply 8 has risen to the upper limit threshold value Vth2 of V1 or higher (YES in Step S100). In this case, the voltage monitoring circuit 13 detects rise of the output voltage V1 of the power supply 8 (Step S101), and cuts off the SW 9 (Step S102). Consequently, the power-supply voltage Vlogic supplied to the control circuit 2 is finally switched from the output voltage V1 of the power supply 8 to V2−Vf that is lower than the output voltage V2 of the power supply 10 by the forward voltage Vf of the diode 12 (Step S103). The control circuit 2 then executes a stop sequence (Step S104).

It is assumed that output voltage V1 of the power supply 8 has dropped to the lower limit threshold value Vth1 of V1 or lower (YES in Step S110). In this case, the voltage monitoring circuit 13 detects drop of the output voltage V1 of the power supply 8 (Step S111), and cuts off the SW 9 (Step S112). Consequently, the power-supply voltage Vlogic supplied to the control circuit 2 is finally switched from the output voltage V1 of the power supply 8 to V2−Vf that is lower than the output voltage V2 of the power supply 10 by the forward voltage Vf of the diode 12 (Step S113). The control circuit 2 then executes the stop sequence (Step S114).

It is assumed that the output voltage V2 of the power supply 10 has risen to the upper limit threshold value Vth3 of V2 or higher (YES in Step S120). In this case, the voltage monitoring circuit 14 detects rise of the output voltage V2 of the power supply 10 (Step S121), and cuts off the SW 11 (Step S122). Consequently, the power-supply voltage Vlogic supplied to the control circuit 2 maintains the output voltage V1 of the power supply 8 (Step S123). The control circuit 2 then executes the stop sequence (Step S124).

It is assumed that output voltage V2 of the power supply 10 has dropped to the lower limit threshold value Vth4 of V2 or lower (YES in Step S130). In this case, the voltage monitoring circuit 14 detects drop of the output voltage V2 of the power supply 10 (Step S131), and cuts off the SW 11 (Step S132). Consequently, the power-supply voltage Vlogic supplied to the control circuit 2 maintains the output voltage V1 of the power supply 8 (Step S133). The control circuit 2 then executes the stop sequence (Step S134).

In a case where the output voltage V1 of the power supply 8 neither has risen nor dropped (NO in both Steps S100 and S110) and the output voltage V2 of the power supply 10 neither has risen nor dropped (NO in both Steps S120 and S130), the process returns to Step S100 again.

<Advantageous Effect of First Embodiment>

According to this first embodiment, the power supply 10 that supplies a power-supply voltage to the analog circuit 3 other than the control circuit 2 is used as a redundant power supply for the control circuit 2. When an abnormality (voltage drop or rise) occurs in the output voltage V1 of the regular power supply 8 for the control circuit 2, supply of the output voltage V1 of the power supply 8 to the control circuit 2 is cut off by the SW 9, and the output voltage V2 of the power supply 10 is supplied to the control circuit 2 by a power-supply switching circuit constituted by the SW 11 and the diode 12.

In this manner, the power supply 10 that supplies the power-supply voltage to the analog circuit 3 other than the control circuit 2 is used as the redundant power supply for the control circuit 2 and no spare power supply is provided. Therefore, it is possible to suppress an area impact by making a power supply for the control circuit 2 redundant.

Further, when an abnormality occurs in the output voltage V1 of the regular power supply 8 for the control circuit 2, supply of the output voltage V1 of the power supply 8 to the control circuit 2 is cut off and the output voltage V2 of the power supply 10 is supplied to the control circuit 2. Therefore, the control circuit 2 can maintain a normal operation. Furthermore, in a case where the abnormality in the output voltage V1 of the power supply 8 is voltage rise, it is also possible to protect the control circuit 2 against overvoltage breakdown.

Therefore, even if an abnormality occurs in the output voltage V1 of the regular power supply 8, the control circuit 2 can execute a stop sequence. Accordingly, it is possible to safely stop the analog circuit 3 inside the system LSI 1A without breaking it. Also, transmission of an unintended signal from the control circuit 2 to the inside or outside of the system LSI 1A is suppressed. Therefore, a malfunction of the power-supply system 100 can be prevented.

In addition, according to this first embodiment, when an abnormality (voltage drop or rise) occurs in the output voltage V2 of the power supply 10 that is a redundant power supply for the control circuit 2, supply of the output voltage V2 of the power supply 10 to the control circuit 2 is cut off by the SW 11.

Therefore, also in a case where the abnormality in the output voltage V2 of the power supply 10 is voltage rise, it is possible to protect the control circuit 2 against overvoltage breakdown.

(2) Second Embodiment

The above-described first embodiment achieves a power-supply switching circuit by a SW and a diode.

On the other hand, this second embodiment achieves the power-supply switching circuit by a clamp circuit.

<Configuration of Second Embodiment>

Figure 8:
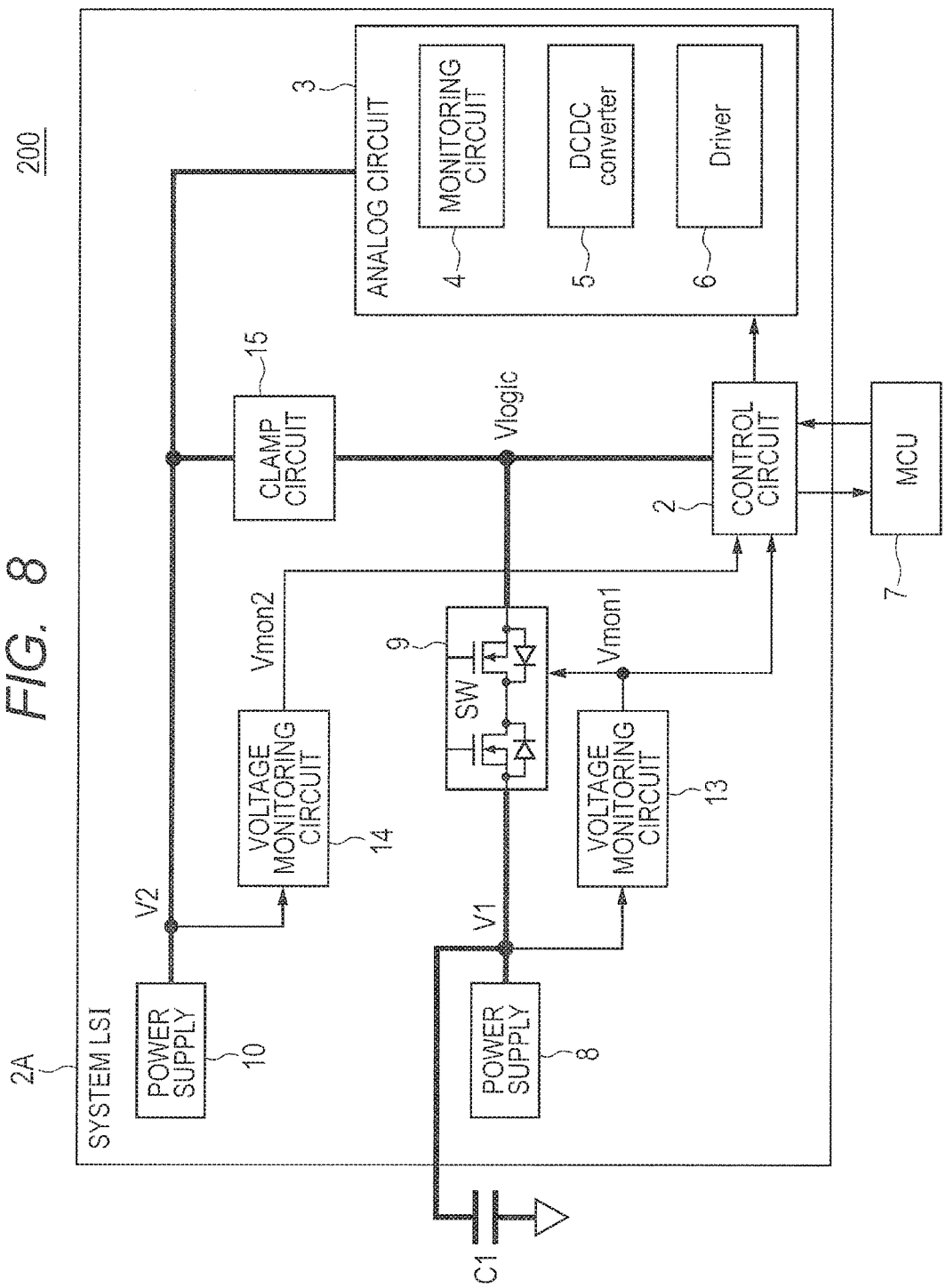
FIG. 8 is a circuit diagram illustrating a configuration example of a power-supply system 200 according to a second embodiment.

First, referring to FIG. 8, a configuration of a power-supply system 200 according to this second embodiment is described. FIG. 8 is a circuit diagram illustrating a configuration example of the power-supply system 200 according to this second embodiment.

As illustrated in FIG. 8, the power-supply system 200 according to this second embodiment is different from the power-supply system 100 according to the above-described first embodiment in that a system LSI 2A is provided in place of the system LSI 1A. The system LSI 2A corresponds to a semiconductor device according to this second embodiment. Further, the system LSI 2A is different from the above-described system LSI 1A in that a clamp circuit 15 is provided in place of the SW 11 and the diode 12.

In this second embodiment, the power supply 10 is coupled to the control circuit 2 via the clamp circuit 15. The clamp circuit 15 clamps the output voltage V2 of the power supply 10 to a clamp voltage V2_clamp. It is assumed that a voltage supplied to the control circuit 2 via the clamp circuit 15 as the power-supply voltage Vlogic is restricted to the clamp voltage V2_clamp lower than the output voltage V1 of the power supply 8 (for example, in a case where V1 is 3.3 V, V2_clamp is 2.5 V).

Further, because the clamp circuit 15 always restricts the output voltage V2 of the power supply 10 to the clamp voltage V2_clamp, it is unnecessary to receive the detection signal Vmon2 indicating a result of monitoring V2. Therefore, the voltage monitoring circuit 14 outputs the detection signal Vmon2 to the control circuit 2 only.

Other configurations are the same as those in the first embodiment, and therefore the description thereof is omitted.

<Operations in Second Embodiment>

As operations of the system LSI 2A according to this second embodiment, operations in a case where an abnormality occurs in the output voltage V1 of the power supply 8 and the output voltage V2 of the power supply 10 are described below. The following description is provided assuming that both normal voltage values of the output voltage V1 of the power supply 8 and the output voltage V2 of the power supply 10 are 3.3 V and the clamp voltage V2_clamp by the clamp circuit 15 is 2.5 V.

<Operation in a Case where Output Voltage V1 of Power Supply 8 Drops>

Figure 9:
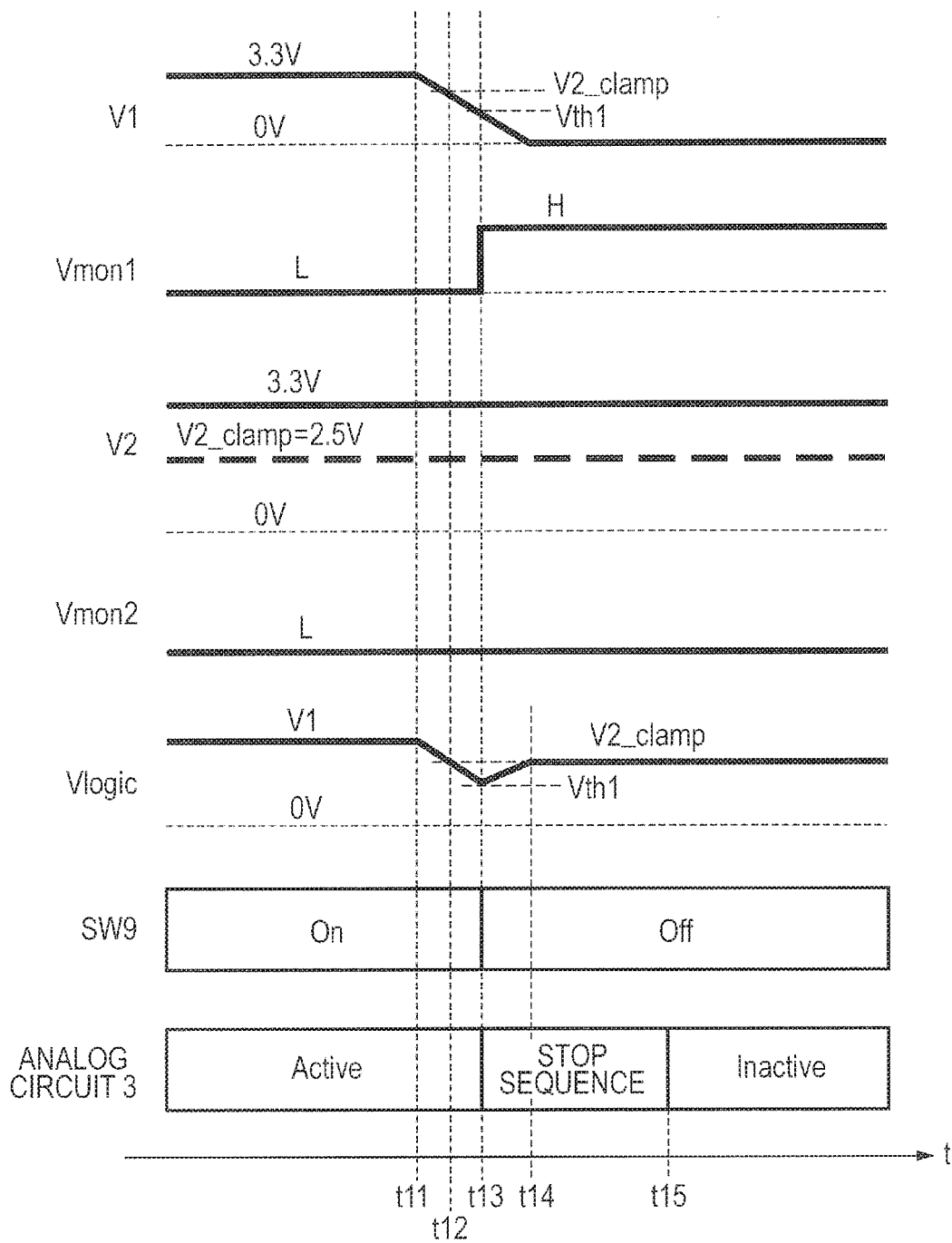
FIG. 9 is a timing chart illustrating an operation example of a system LSI 2A according to the second embodiment in a case where the output voltage V1 of the power supply 8 drops.

First, referring to FIG. 9, an operation example in a case where the output voltage V1 of the power supply 8 drops is described. FIG. 9 is a timing chart illustrating an operation example of the system LSI 2A according to the second embodiment in a case where the output voltage V1 of the power supply 8 drops. It is assumed here that the output voltage V1 of the power supply 8 gradually drops from 3.3 V to 0 V. Further, it is assumed that a magnitude relation between the lower limit threshold value Vth1 of the output voltage V1 and the clamp voltage V2_clamp is set to satisfy Vth1≤V2_clamp.

As illustrated in FIG. 9, in an initial state, both the output voltage V1 of the power supply 8 and the output voltage V2 of the power supply 10 are 3.3 V, that is, are normal. Therefore, the output voltage V1 of the power supply 8, which is 3.3 V, is supplied to the control circuit 2 as the power-supply voltage Vlogic. Further, the analog circuit 3 in the system LSI 2A is active.

At a time t11, when the output voltage V1 of the power supply 8 drops from 3.3 V, the power-supply voltage Vlogic supplied to the control circuit 2 also drops.

At a time t12, when the output voltage V1 of the power supply 8 drops to the clamp voltage V2_clamp or lower, the output voltage V2 of the power supply 10 is also supplied to the control circuit 2. Therefore, from the time t12 to a time t13, both the output voltage V1 of the power supply 8 and the output voltage V2 of the power supply 10 are supplied to the control circuit 2 as the power-supply voltage Vlogic.

The subsequent operation is the same as the operation in FIG. 2 of the above-described first embodiment, and the description thereof is omitted.

The above-described operation is an operation in a case where Vth1≤V2_clamp is set. Meanwhile, an operation in a case where Vth1>V2_clamp is set corresponds to an operation achieved by replacing V2−Vf in the operation in FIG. 3 of the above-described first embodiment with V2_clamp, and therefore the description thereof is omitted.

<Operation in a Case where Output Voltage V1 of Power Supply 8 Rises>

Figure 10:
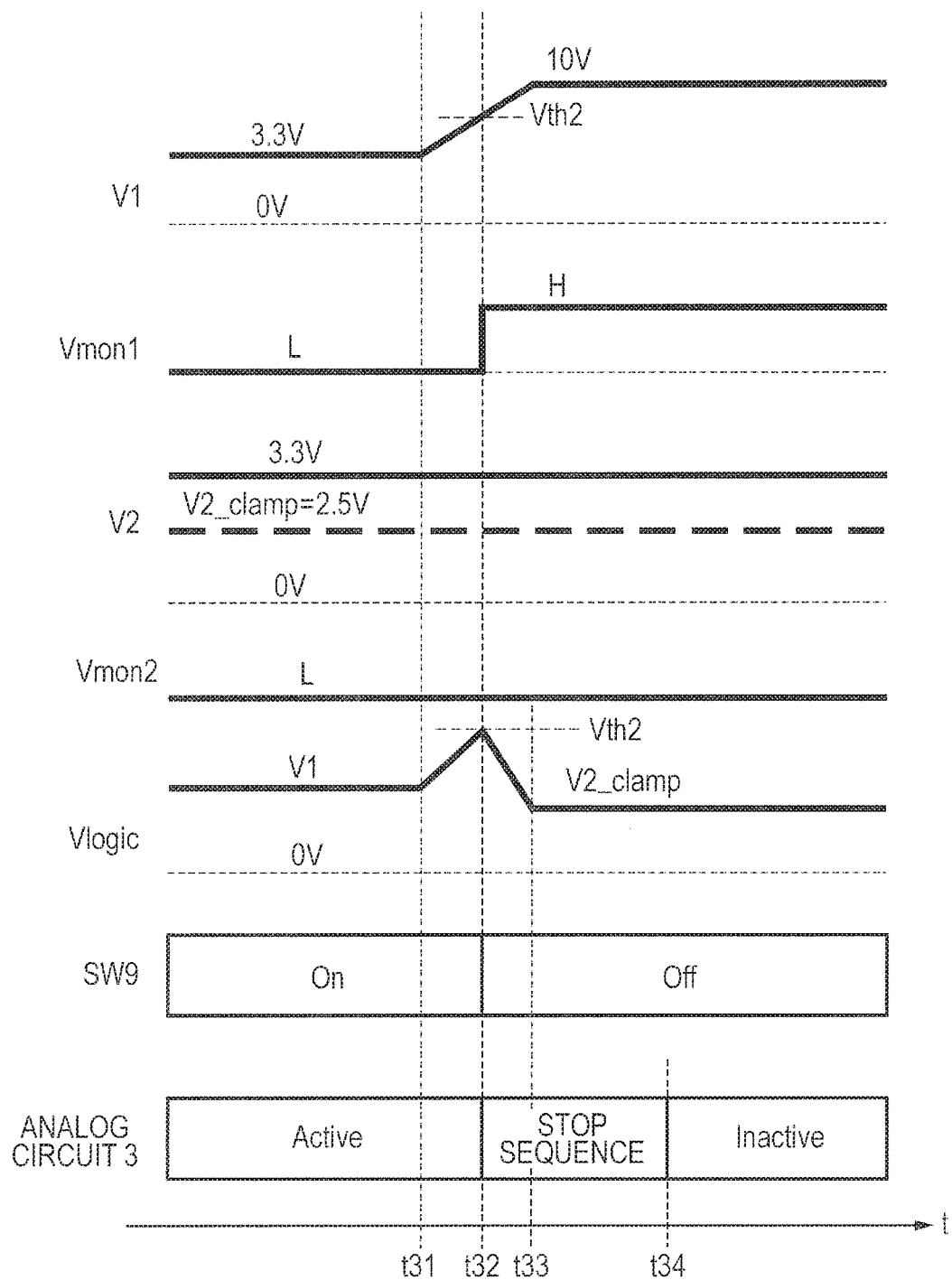
FIG. 10 is a timing chart illustrating an operation example of the system LSI 2A according to the second embodiment in a case where the output voltage V1 of the power supply 8 rises.

Subsequently, referring to FIG. 10, an operation example in a case where the output voltage V1 of the power supply 8 rises is described. FIG. 10 is a timing chart illustrating an operation example of the system LSI 2A according to this second embodiment in a case where the output voltage V1 of the power supply 8 rises. It is assumed here that the output voltage V1 of the power supply 8 gradually rises from 3.3 V to 10 V. Further, the upper limit threshold value Vth2 of the output voltage V1 of the power supply 8 is any value at which the control circuit 2 is not broken.

As illustrated in FIG. 10, the initial state is the same as that in FIG. 9.

At a time t31, when the output voltage V1 of the power supply 8 rises from 3.3 V, the power-supply voltage Vlogic supplied to the control circuit 2 also rises.

At a time t32, when the output voltage V1 of the power supply 8 rises to the upper limit threshold value Vth2 of V1 or higher, the voltage monitoring circuit 13 detects the voltage rise of V1 and switches the detection signal Vmon1 from L to H. In response to this switching, the SW 9 is turned off, so that supply of the output voltage V1 of the power supply 8 to the control circuit 2 is cut off. Therefore, after the time t32, the output voltage V2 of the power supply 10 is supplied to the control circuit 2.

After the time t32, the power-supply voltage Vlogic supplied to the control circuit 2 gradually drops, and reaches V2_clamp at a time t33 after a delay time caused by a capacitance component (not illustrated) coupled to an input stage of the control circuit 2. Therefore, it is possible to maintain a normal operation of the control circuit 2 while protecting the control circuit 2 against overvoltage breakdown.

The subsequent operation is the same as the operation in FIG. 4 of the above-described first embodiment, and the description thereof is omitted.

<Operation in a Case where Output Voltage V2 of Power Supply 10 Rises>

Figure 11:
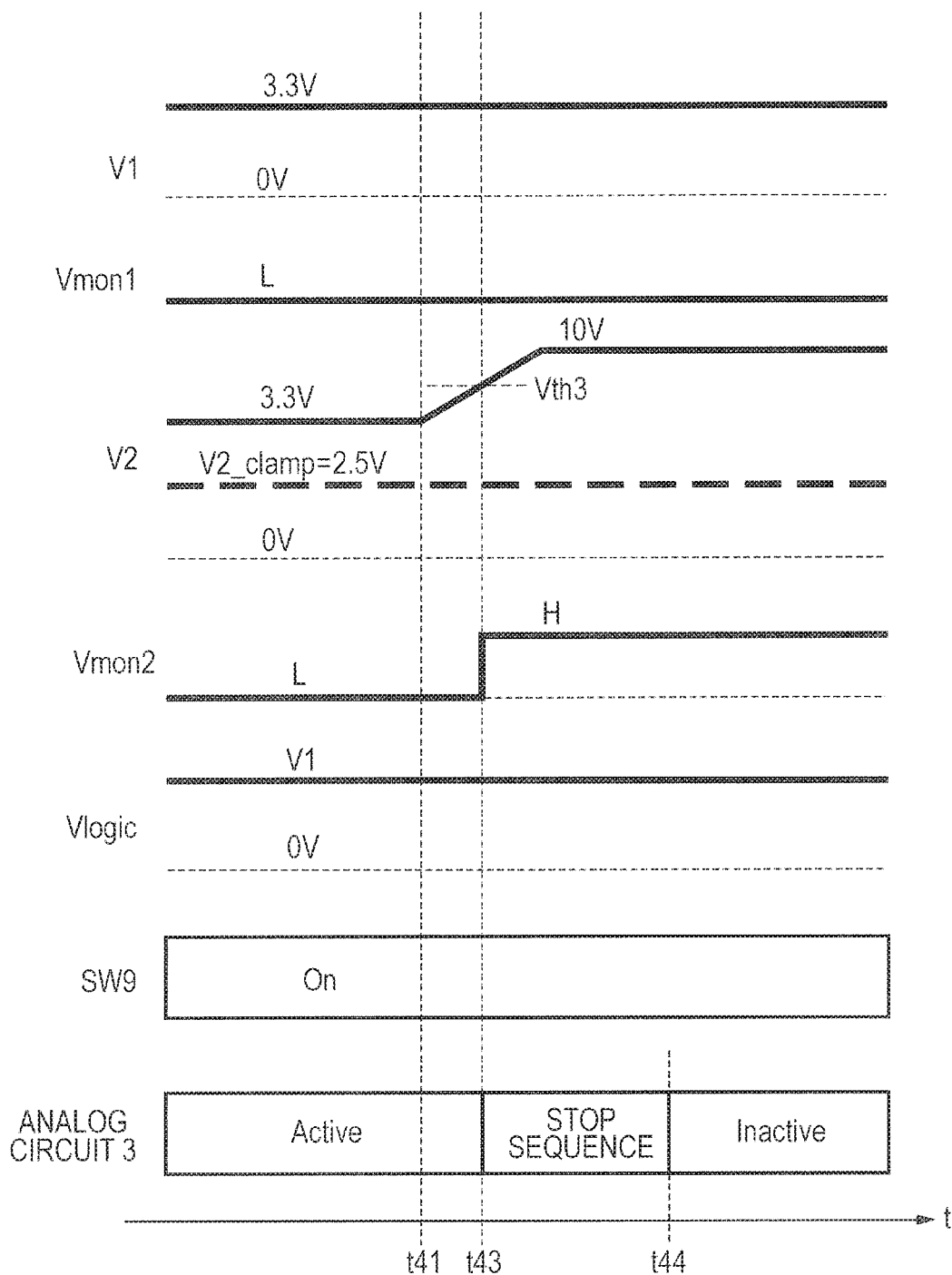
FIG. 11 is a timing chart illustrating an operation example of the system LSI 2A according to the second embodiment in a case where the output voltage V2 of the power supply 10 rises.

Subsequently, referring to FIG. 11, an operation example in a case where the output voltage V2 of the power supply 10 rises is described. FIG. 11 is a timing chart illustrating an operation example of the system LSI 2A according to this second embodiment in a case where the output voltage V2 of the power supply 10 rises. It is assumed here that the output voltage V2 of the power supply 10 gradually rises from 3.3 V to 10 V. Further, the upper limit threshold value Vth3 of the output voltage V2 of the power supply 10 is any value at which the analog circuit 3 and the control circuit 2 are not broken.

As illustrated in FIG. 11, the initial state is the same as that in FIG. 9.

At a time t41, the output voltage V2 of the power supply 10 rises from 3.3 V.

At a time t43, when the output voltage V2 of the power supply 10 rises to the upper limit threshold value Vth3 of V2 or higher, the voltage monitoring circuit 14 detects the voltage rise of V2 and switches the detection signal Vmon2 from L to H.

At this time, the clamp voltage V2_clamp supplied to the control circuit 2 from the power supply 10 via the clamp circuit 15 is restricted to 2.5 V and is not changed even when V2 rises. Therefore, the voltage rise of the output voltage V2 of the power supply 10 is not propagated to the control circuit 2, and a state where the output voltage V1 of the power supply 8 is supplied to the control circuit 2 as the power-supply voltage Vlogic is maintained. Therefore, it is possible to maintain a normal operation of the control circuit 2 while protecting the control circuit 2 against overvoltage breakdown.

The subsequent operation is the same as the operation in FIG. 5 of the above-described first embodiment, and the description thereof is omitted.

<Operation in a Case where Output Voltage V2 of Power Supply 10 Drops>

Figure 12:
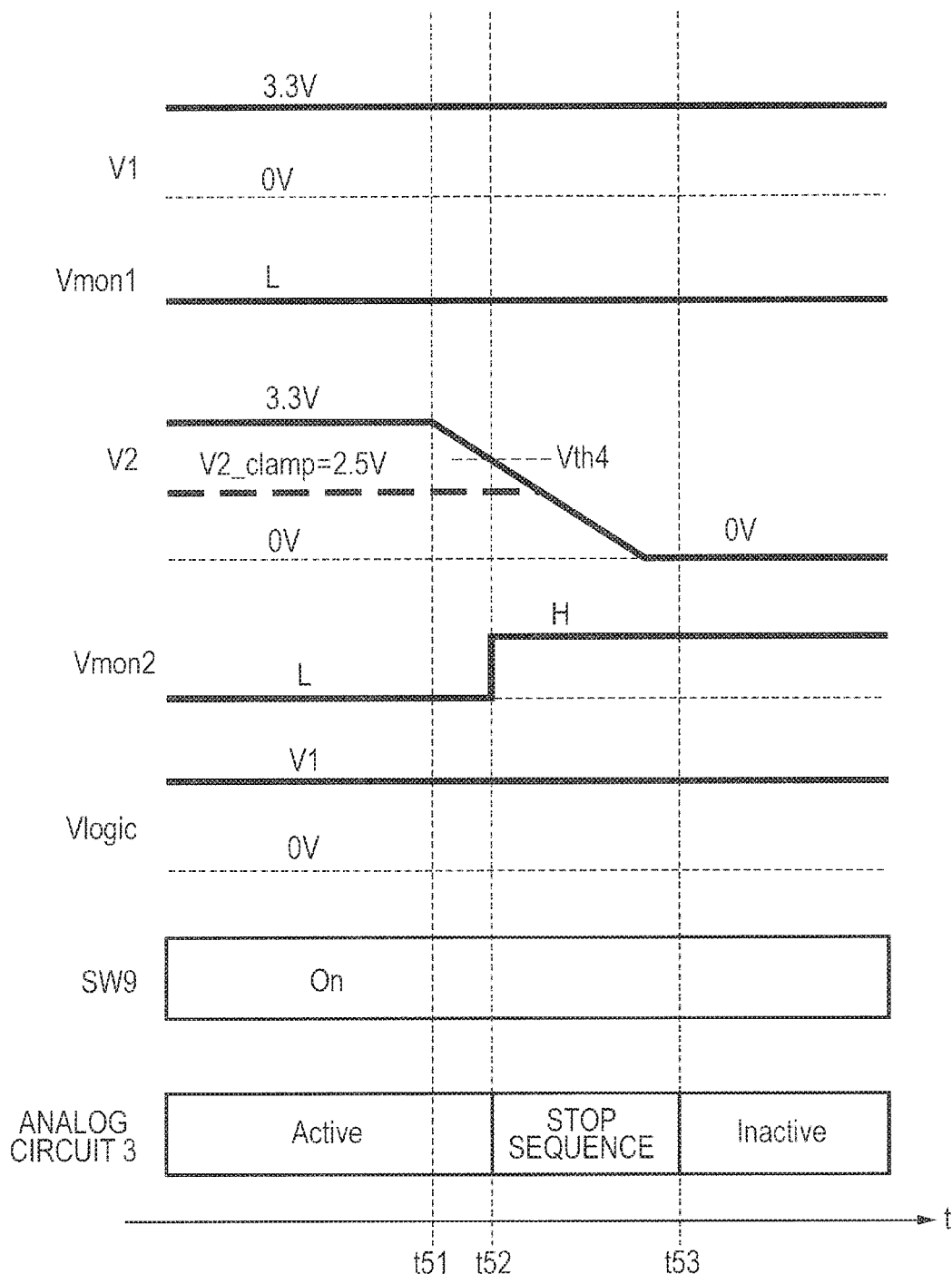
FIG. 12 is a timing chart illustrating an operation example of the system LSI 2A according to the second embodiment in a case where the output voltage V2 of the power supply 10 drops.

Subsequently, referring to FIG. 12, an operation example in a case where the output voltage V2 of the power supply 10 drops is described. FIG. 12 is a timing chart illustrating an operation example of the system LSI 2A according to the second embodiment in a case where the output voltage V2 of the power supply 10 drops. It is assumed here that the output voltage V2 of the power supply 10 gradually drops from 3.3 V to 0 V. Further, the lower limit threshold value Vth4 of the output voltage V2 of the power supply 10 is any value that is lower than 3.3 V and is higher than the clamp voltage V2_clamp, 2.5 V.

As illustrated in FIG. 12, the initial state is the same as that in FIG. 9.

At a time t51, the output voltage V2 of the power supply 10 drops from 3.3 V.

At a time t52, when the output voltage V2 of the power supply 10 drops to the lower limit threshold value Vth4 of V2 or lower, the voltage monitoring circuit 14 detects the voltage drop of V2 and switches the detection signal Vmon2 from L to H.

At this time, the clamp voltage V2_clamp supplied to the control circuit 2 from the power supply 10 via the clamp circuit 15 is restricted to 2.5 V. Therefore, the voltage drop of the output voltage V2 of the power supply 10 is not propagated to the control circuit 2, and a state where the output voltage V1 of the power supply 8 is supplied to the control circuit 2 as the power-supply voltage Vlogic is maintained. Therefore, a normal operation of the control circuit 2 can be maintained.

The subsequent operation is the same as the operation in FIG. 6 of the above-described first embodiment, and the description thereof is omitted.

<Advantageous Effect of Second Embodiment>

According this second embodiment, the clamp circuit 15 is used as a power-supply switching circuit. The clamp circuit 15 does not use the detection signal Vmon2 output from the voltage monitoring circuit 14 monitoring the output voltage V2 of the power supply 10, but always restricts V2 to the clamp voltage V2_clamp. Therefore, even in a case where a voltage change that is steeper than a response time of the voltage monitoring circuit 14 occurs, it is possible to suppress rise of the power-supply voltage Vlogic.

Other advantageous effects are the same as those in the first embodiment.

(3) Third Embodiment

The above-described first and second embodiments use a power supply in the same semiconductor device as a redundant power supply for a control circuit.

On the other hand, this third embodiment uses a power supply in a different semiconductor device as a redundant power supply for a control circuit.

<Configuration of Third Embodiment>

Figure 13:
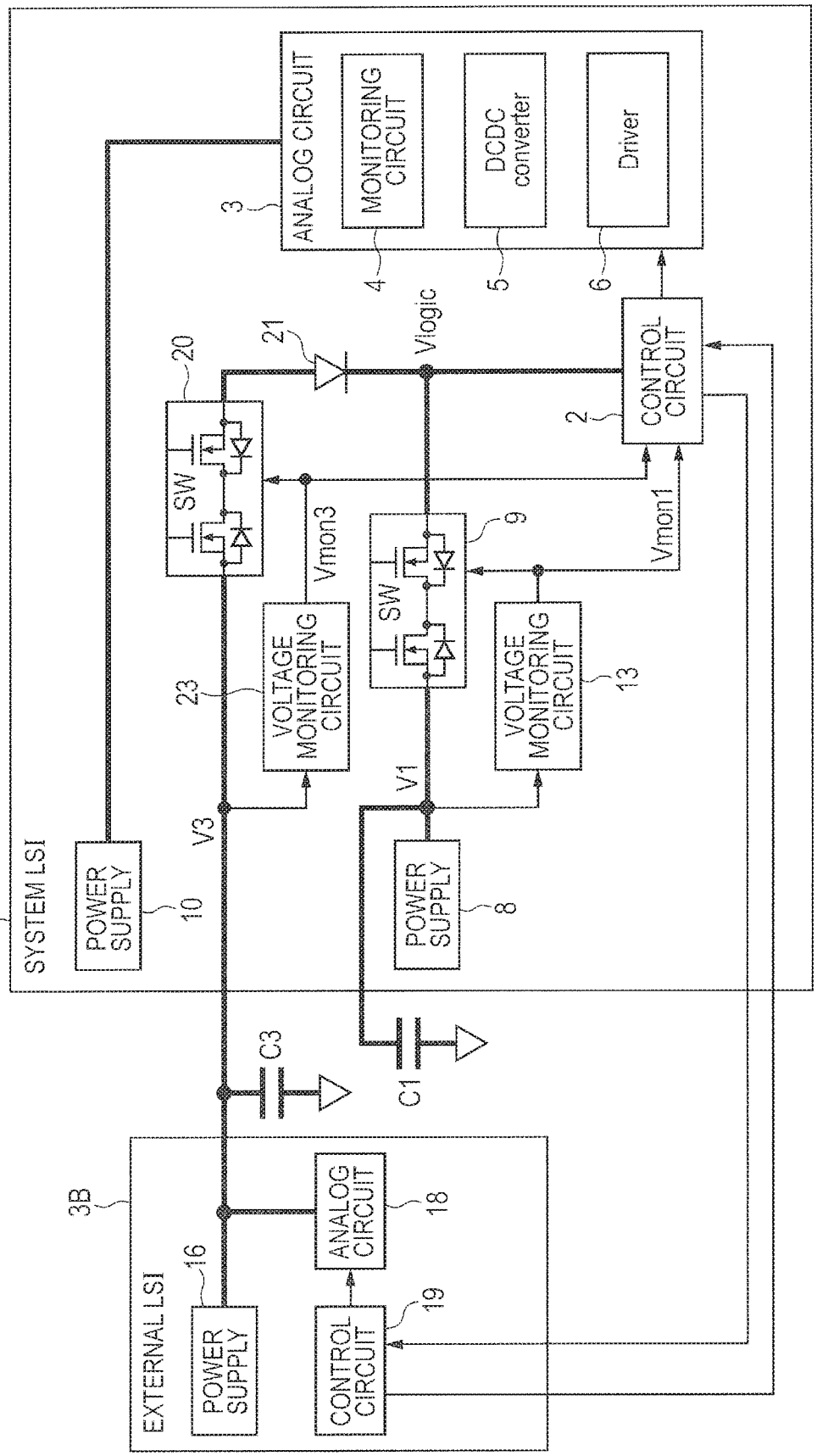
FIG. 13 is a circuit diagram illustrating a configuration example of a power-supply system 300 according to a third embodiment.

First, referring to FIG. 13, a configuration of a power-supply system 300 according to this third embodiment is described. FIG. 13 is a circuit diagram illustrating a configuration example of the power-supply system 300 according to this third embodiment.

As illustrated in FIG. 13, the power-supply system 300 according to this third embodiment is different from the power-supply system 100 according to the above-described first embodiment in that a system LSI 3A is provided in place of the system LSI 1A and an external LSI 3B that has a power supply and is coupled to the system LSI 3A is further provided. The system LSI 3A corresponds to a semiconductor device according to this third embodiment. Further, the system LSI 3A is different from the above-described system LSI 1A in that a voltage monitoring circuit (a second voltage monitoring circuit) 23, a SW (second switch) 20, and a diode 21 are provided in place of the voltage monitoring circuit 14, the SW 11 and the diode 12.

The external LSI 3B includes a power supply (a second power supply) 16, an analog circuit (a circuit to which power supply is supplied) 18, and a control circuit 19.

The control circuit 19 controls an operation of the analog circuit 18 and communicates with the control circuit 2 in the system LSI 3A.

The analog circuit 18 corresponds to the analog circuit 3 in the system LSI 3A, and includes a monitoring circuit, a DCDC converter, and a driver as with the analog circuit 3, for example.

The power supply 16 is a power supply for the analog circuit 18, which outputs a voltage V3 that is supplied to the analog circuit 18 as a power-supply voltage. The power supply 16 is directly coupled to the analog circuit 18. Therefore, the output voltage V3 of the power supply 16 is directly supplied to the analog circuit 18.

The power supply 16 is also coupled to the control circuit 2 via the SW 20 and the diode 21 in the system LSI 3A. In more detail, the SW 20 is coupled to the power supply 16, a cathode of the diode 21 is coupled to the control circuit 2, and an anode of the diode 21 and the SW 20 are coupled to each other. Therefore, the output voltage V3 of the power supply 16 can be also supplied to the control circuit 2 via the SW 20 and the diode 21. Accordingly, the power supply 16 also serves as a redundant power supply for the control circuit 2.

The voltage monitoring circuit 23 monitors the output voltage V3 of the power supply 16, and outputs a detection signal Vmon3 indicating a result of that monitoring to the SW 20 and the control circuit 2. Upon detecting an abnormality (voltage drop or rise) in the output voltage V3 of the power supply 16, the voltage monitoring circuit 23 switches the detection signal Vmon3 from L to H.

When the detection signal Vmon3 output from the voltage monitoring circuit 23 is switched from L to H, the SW 20 is turned off and cuts off supply of the output voltage V3 of the power supply 16 to the control circuit 2.

The diode 21 is a diode of which a forward voltage is Vf.

The SW 20 and the diode 21 constitute a power-supply switching circuit. In a state where supply of the output voltage V1 of the power supply 8 to the control circuit 2 is cut off by the SW 9, this power-supply switching circuit supplies the output voltage V3 of the power supply 16 to the control circuit 2. A voltage supplied as the power-supply voltage Vlogic to the control circuit 2 via this power-supply switching circuit is V3−Vf that is lower than the output voltage V3 of the power supply 16 by the forward voltage Vf of the diode 12.

Other configurations are the same as those in the above-described first embodiment, and therefore the description thereof is omitted.

<Operations in Third Embodiment>

Figure 14:
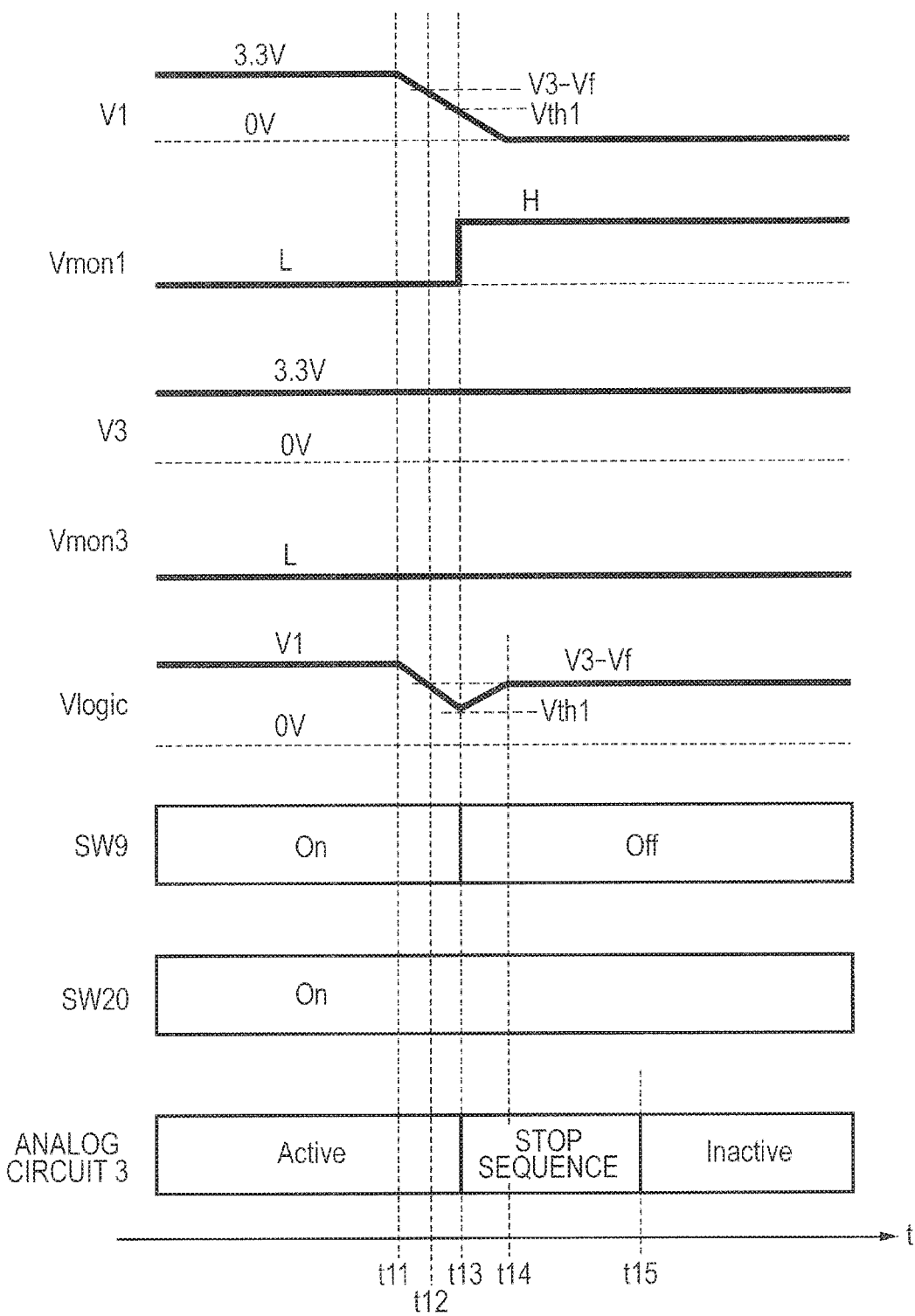
FIG. 14 is a timing chart illustrating an operation example of a system LSI 3A according to the third embodiment in a case where the output voltage V1 of the power supply 8 drops.
Figure 15:
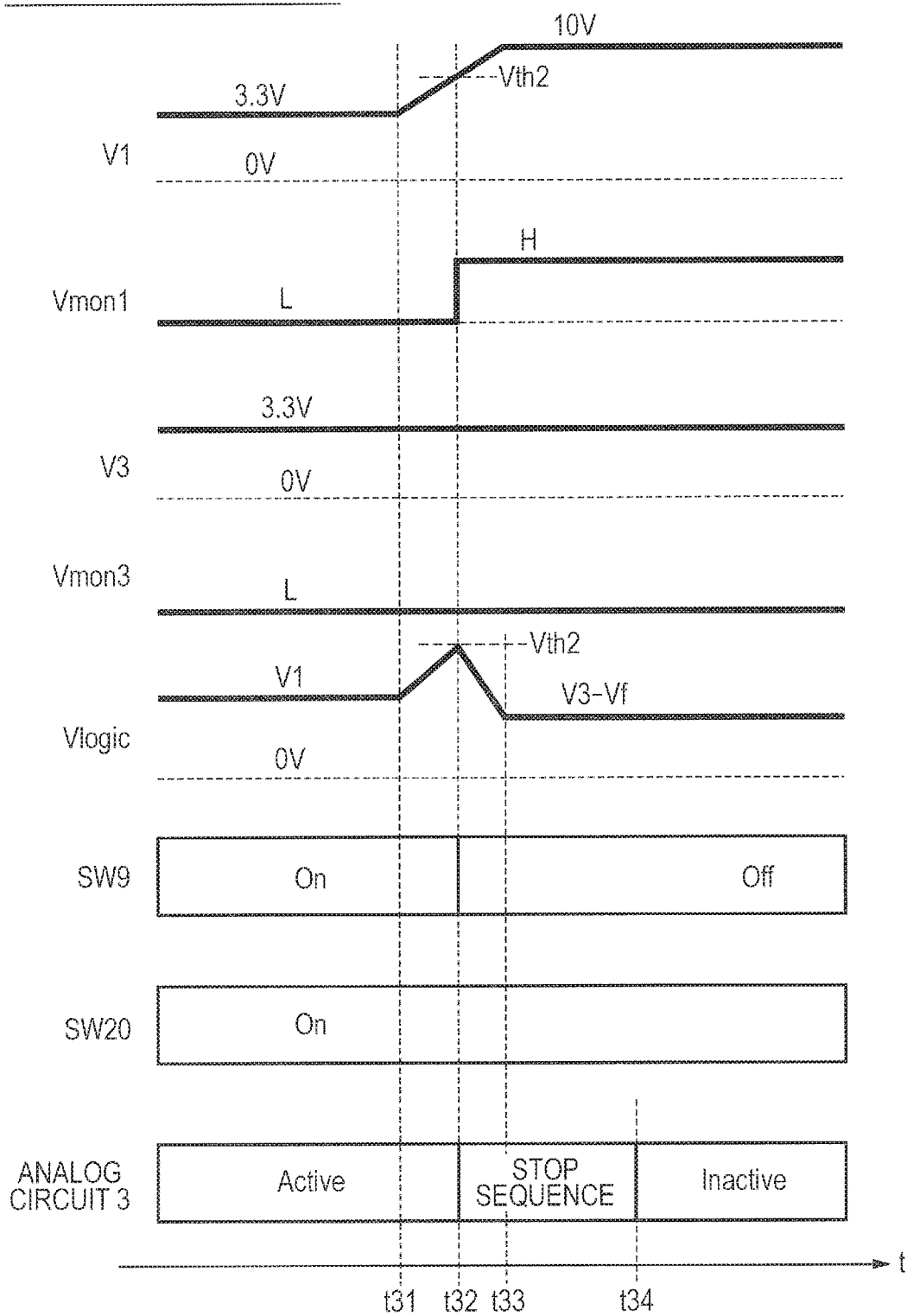
FIG. 15 is a timing chart illustrating an operation example of the system LSI 3A according to the third embodiment in a case where the output voltage V1 of the power supply 8 rises.
Figure 16:
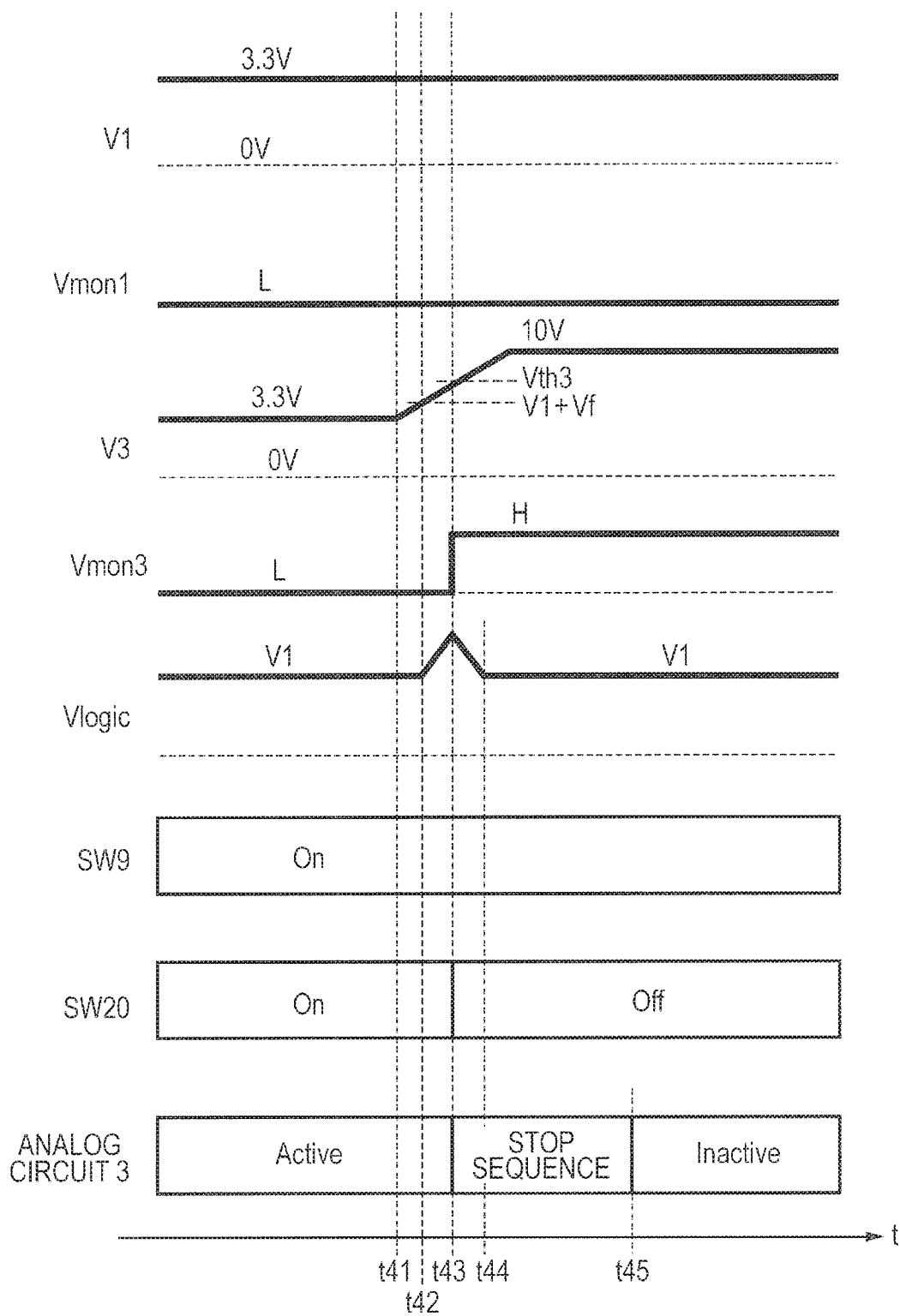
FIG. 16 is a timing chart illustrating an operation example of the system LSI 3A according to the third embodiment in a case where an output voltage V3 of a power supply 16 rises.
Figure 17:
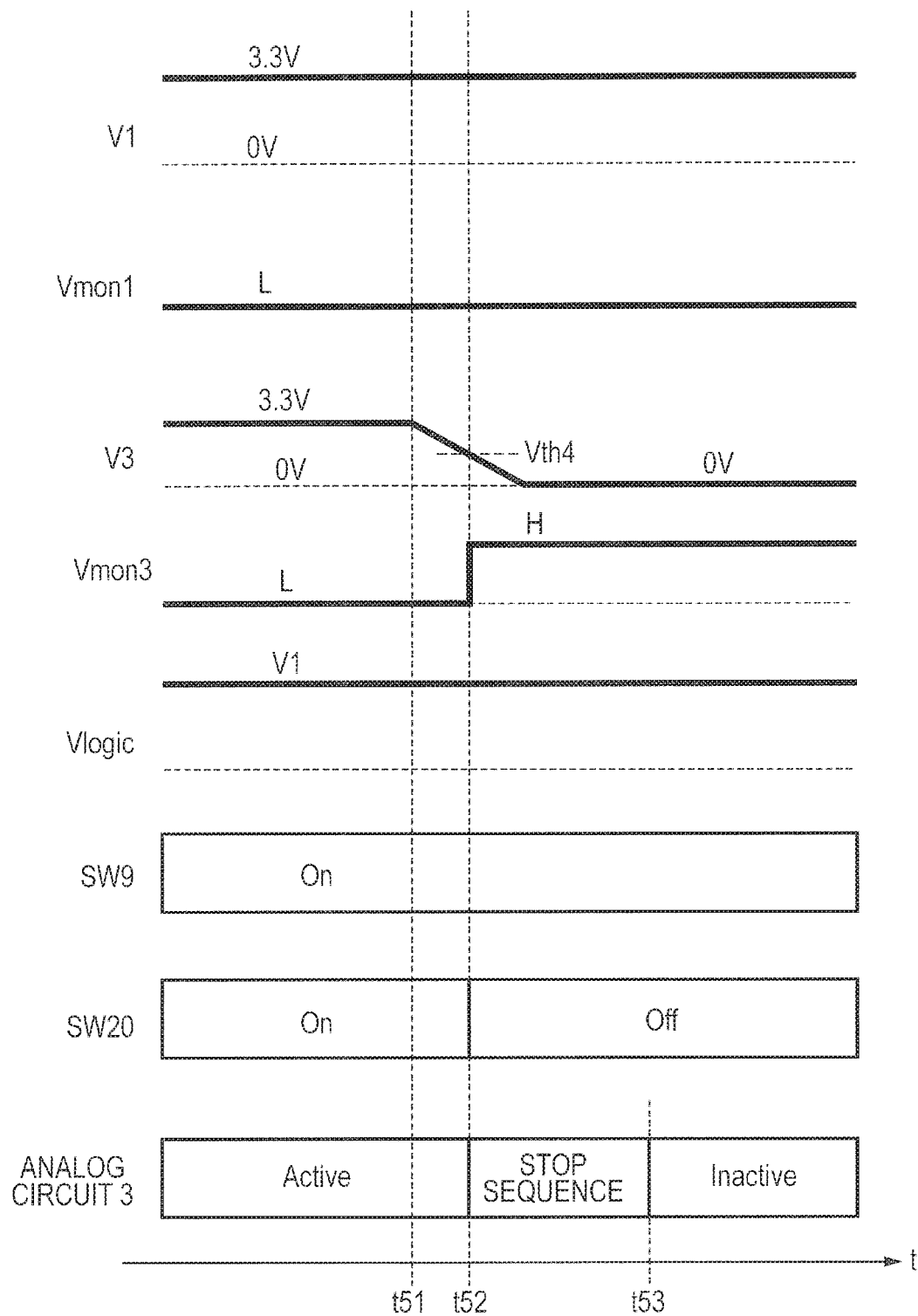
FIG. 17 is a timing chart illustrating an operation example of the system LSI 3A according to the third embodiment in a case where the output voltage V3 of the power supply 16 drops.

FIG. 14 is a timing chart illustrating an operation example of the system LSI 3A according to this third embodiment in a case where the output voltage V1 of the power supply 8 drops in a state where Vth1<V3−Vf is set. FIG. 15 is a timing chart illustrating an operation example in a case where the output voltage V1 of the power supply 8 rises. FIG. 16 is a timing chart illustrating an operation example in a case where the output voltage V3 of the power supply 16 rises. FIG. 17 is a timing chart illustrating an operation example in a case where the output voltage V3 of the power supply 16 drops.

Operations in FIGS. 14 to 17 of this third embodiment correspond to operations achieved by replacing the power supply 10 in the operations in FIGS. 2 and 4 to 7 of the above-described first embodiment with the power supply 16, and therefore the description thereof is omitted.

Further, an operation of the system LSI 3A according to this third embodiment in a case where the output voltage V1 of the power supply 8 drops in a state where Vth1>V3−Vf is set corresponds to an operation achieved by replacing the power supply 10 in the operation in FIG. 3 of the above-described first embodiment with the power supply 16, and therefore the description thereof is omitted.

<Advantageous Effect of Third Embodiment>

According to this third embodiment, the power supply 16 in the external LSI 3B that is different from the system LSI 3A is used as a redundant power supply for the control circuit 2. In a case where the power supply 8 and the power supply 10 inside the system LSI 3A have broken down for a common cause (for example, in a case where the same band-gap circuit is used as a reference voltage for both the power supplies), an abnormality occurs in both the power supply 8 and the power supply 10 simultaneously, and it is likely that a stop sequence cannot be executed and the control circuit 2 stops. However, by using the power supply 16 inside the external LSI 3B different from the system LSI 3A as a redundant power supply for the control circuit 2, a sufficient voltage for executing a stop sequence is supplied to the control circuit 2, even in a case where the abnormality has occurred in the power supply 8 and the power supply 10 inside the system LSI 3A simultaneously.

Other advantageous effects are the same as those in the first embodiment.

(4) Concept of First to Third Embodiments

Figure 18:
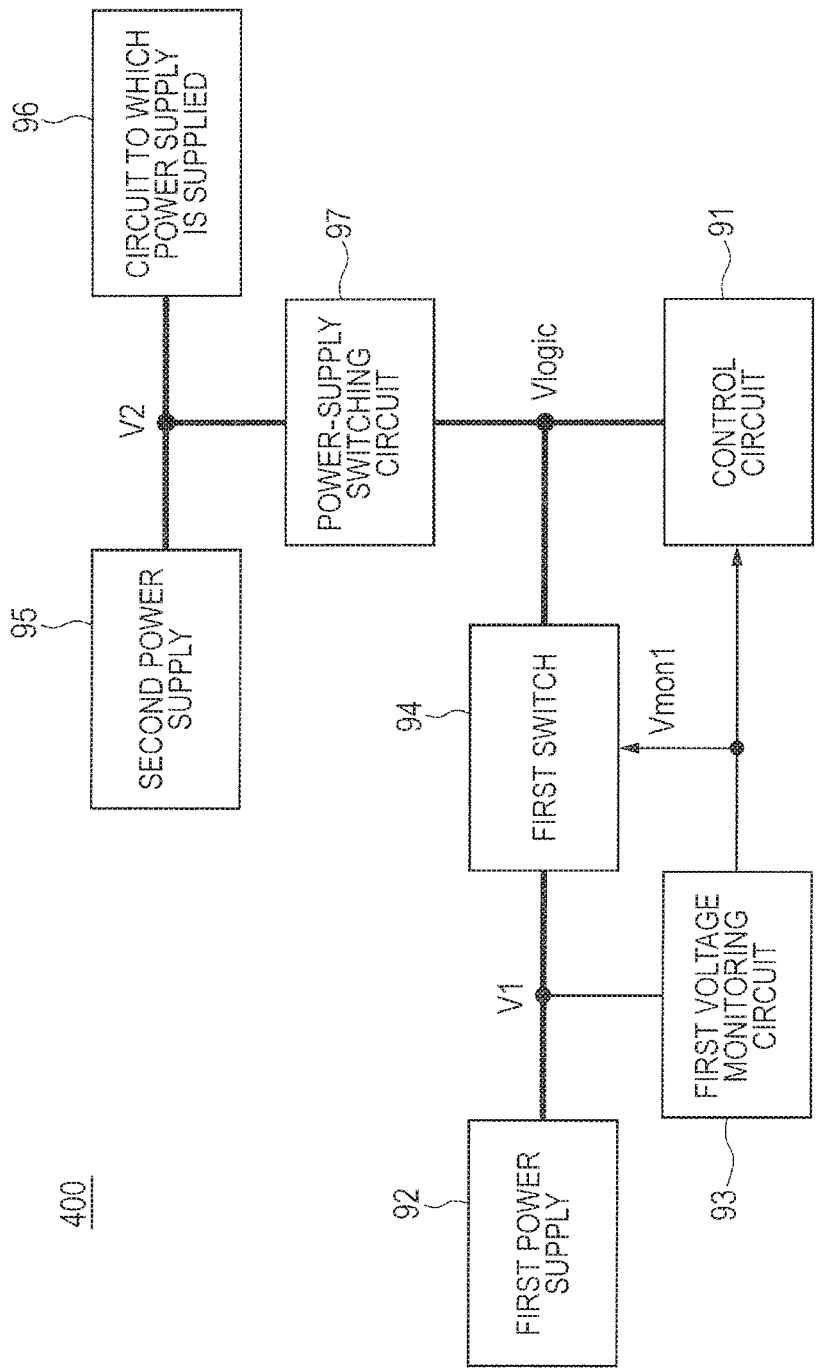
FIG. 18 is a circuit diagram illustrating a configuration example of a power-supply system 400 that conceptually illustrates the first to third embodiments.

Next, the concept of the above-described first to third embodiments is described, referring to FIG. 18. FIG. 18 is a circuit diagram illustrating a configuration example of a power-supply system 400 that conceptually illustrates the above-described first to third embodiments.

As illustrated in FIG. 18, the power-supply system 400 includes a control circuit 91, a first power supply 92, a first voltage monitoring circuit 93, a first switch 94, a second power supply 95, a circuit to which power supply is supplied 96, and a power-supply switching circuit 97.

The control circuit 91 corresponds to the control circuit 2 in the first to third embodiments.

The first power supply 92 outputs a first voltage V1 supplied to the control circuit 91 as a power-supply voltage Vlogic. The first power supply 92 corresponds to the power supply 8 in the first to third embodiments.

The first voltage monitoring circuit 93 determines whether the first voltage V1 is abnormal, and outputs a signal Vmon1 indicating a result of the determination to the first switch 94 and the control circuit 91. The first voltage monitoring circuit 93 determines that the first voltage V1 is abnormal in a case where the first voltage V1 is equal to or higher than the upper limit threshold voltage Vth2 of V1 or is equal to or lower than the lower limit threshold value Vth1 of V1, for example. The first voltage monitoring circuit 93 corresponds to the voltage monitoring circuit 13 in the first to third embodiments.

The first switch 94 is coupled to the first power supply 92 and the control circuit 91. The first switch 94 is turned off when it is determined by the first voltage monitoring circuit 93 that the first voltage V1 is abnormal, and cuts off supply of the first voltage V1 to the control circuit 91. The first switch 94 corresponds to the SW 9 in the first to third embodiments.

The second power supply 95 outputs a second voltage V2 supplied as a power-supply voltage to the circuit to which power supply is supplied 96 other than the control circuit 91. The second power supply 95 corresponds to the power supply 10 in the first and second embodiments or the power supply 16 in the third embodiment.

To the circuit to which power supply is supplied 96, the power-supply voltage is supplied from the second power supply 95. The circuit to which power supply is supplied 96 corresponds to the analog circuit 3 in the first and second embodiments or the analog circuit 18 in the third embodiment.

The power-supply switching circuit 97 is coupled to the second power supply 95 and the control circuit 91. In a state where supply of the first voltage V1 to the control circuit 91 is cut off by the first switch 94, the power-supply switching circuit 97 supplies the second voltage V2 to the control circuit 91. The power-supply switching circuit 97 corresponds to the SW 11 and the diode 12 in the first embodiment, the clamp circuit 15 in the second embodiment, or the SW 20 and the diode 21 in the third embodiment.

A timing at which the power-supply switching circuit 97 starts supply of the second voltage V2 to the control circuit 91 is not necessarily coincident with a timing at which supply of the first voltage V1 to the control circuit 91 is cut off by the first switch 94, and can be prior to the cut-off timing. That is, it suffices that the power-supply switching circuit 97 has any configuration as long as it supplies the second voltage V2 to the control circuit 91 after supply of the first voltage V1 to the control circuit 91 is cut off by the switch 94.

An embodiment in which all the components of the power-supply system 400 are mounted on the same semiconductor device corresponds to the first and second embodiments. Meanwhile, an embodiment in which the control circuit 91, the first power supply 92, the first voltage monitoring circuit 93, the first switch 94, and the power-supply switching circuit 97 are mounted on a first semiconductor device and the second power supply 95 and the circuit to which power supply is supplied 96 are mounted on a second semiconductor device different from the first semiconductor device corresponds to the third embodiment.

According to the power-supply system 400, the second power supply 95 that supplies a power-supply voltage to the circuit to which power supply is supplied 96 other than the control circuit 91 is used as a redundant power supply for the control circuit 91, and no spare power supply is provided. Therefore, it is possible to suppress an area impact caused by making a power supply for the control circuit 91 redundant.

Further, when an abnormality occurs in the first voltage V1 output from the first power supply 92 for the control circuit 91, supply of the first voltage V1 to the control circuit 91 is cut off by the first switch 94, and the second voltage V2 is supplied to the control circuit 91 by the power-supply switching circuit 97. Therefore, the control circuit 91 can maintain a normal operation.

In the above, the invention made by the inventors of the present application has been specifically described by way of the embodiments. However, it is naturally understood that the present invention is not limited to the aforementioned embodiments, and can be changed in various ways within the scope not departing from the gist thereof.

For example, although the SW 20 and the diode 21 are used as a power-supply switching circuit in the above-described third embodiment, the power-supply switching circuit is not limited thereto. In the third embodiment, the power-supply switching circuit can use a clamp circuit corresponding to the clamp circuit 15 of the above-described second embodiment.

Further, although components inside a semiconductor device are achieved by hardware in the above-described first to third embodiments, all or a portion of the components other than a power supply inside the semiconductor device can be implemented by software by a program read from a memory, for example. In this case, the semiconductor device can be constituted by a computer including a processor that performs arithmetic processing, control, and the like, for example, a CPU (Central Processing Unit), a memory storing a program read out and executed by the processor and various data therein, for example. Therefore, a person skilled in the art would understand that these components can be implemented by hardware only, software only, or a combination of hardware and software in various ways, and implementation of these components is not limited to any one of them.

The above-described program can be stored in various types of non-transitory computer-readable media to be supplied to the computer. The non-transitory computer-readable media include various types of tangible recording media. Examples of the non-transitory computer-readable medium include a magnetic recording medium (for example, a flexible disk, a magnetic tape and a hard disk drive), a magneto-optical recording medium (for example, a magneto-optical disk), a CD-ROM (compact disc read only memory), a CD-R (compact disc recordable), a CD-R/W (compact disc rewritable), and a semiconductor memory (for example, a mask ROM, a PROM (programmable ROM), an EPROM (erasable ROM), a flash ROM, and a RAM (random access memory)). Also, the program can be supplied to the computer by various types transitory computer-readable media. Examples of the transitory computer-readable medium include an electric signal, an optical signal, and an electromagnetic wave. The transitory computer-readable medium can supply the program to the computer via a wired communication path, such as an electric wire and an optical fiber, or a wireless communication path.

What is claimed is:

1. A semiconductor device comprising:
   a control circuit;
   a first power supply that outputs a first voltage to be supplied to the control circuit as a power-supply voltage;
   a first voltage monitoring circuit that determines whether the first voltage is abnormal;
   a first switch that is coupled to the first power supply and the control circuit, and cuts off supply of the first voltage to the control circuit when it is determined that the first voltage is abnormal; and
   a power-supply switching circuit that is coupled to the control circuit and a second power supply that outputs a second voltage to be supplied to a circuit other than the control circuit as a power-supply voltage, and supplies the second voltage to the control circuit in a state where the supply of the first voltage to the control circuit is cut off,
   wherein the first switch includes a first transistor and a first body-diode of the first transistor, an anode of the first body-diode being coupled to the control circuit.

2. The semiconductor device according to claim 1, further comprising a second voltage monitoring circuit that determines whether the second voltage is abnormal,
   wherein the power-supply switching circuit includes
   a second switch that is coupled to the second power supply, and cuts off supply of the second voltage to the control circuit when it is determined that the second voltage is abnormal, and
   a diode that is coupled to the control circuit at a cathode thereof and to the second switch at an anode thereof.

3. The semiconductor device according to claim 1,
   wherein the power-supply switching circuit comprises a clamp circuit that is coupled to the second power supply and the control circuit and clamps the second voltage.

4. The semiconductor device according to claim 3, further comprising a second voltage monitoring circuit that determines whether the second voltage is abnormal.

5. The semiconductor device according to claim 1,
   wherein the second power supply is provided inside the semiconductor device.

6. The semiconductor device according to claim 1,
   wherein the second power supply is provided outside the semiconductor device.

7. The semiconductor device according to claim 1,
   wherein the control circuit executes a stop sequence that stops a circuit inside the semiconductor device and outputs an error signal to outside of the semiconductor device, when it is determined that the first voltage is abnormal.

8. The semiconductor device according to claim 2,
   wherein the control circuit executes a stop sequence that stops a circuit inside the semiconductor device and outputs an error signal to outside of the semiconductor device, when it is determined that the second voltage is abnormal.

9. The semiconductor device according to claim 1,
   wherein the first switch further includes a second transistor coupled to the first transistor and a second body-diode of the second transistor, a cathode of the second body-diode being coupled to a cathode of the first body-diode.

10. The semiconductor device according to claim 2,
    wherein the second switch includes a third transistor and a third body-diode of the third transistor, an anode of the third body-diode being coupled to the anode of the diode.

11. A semiconductor device comprising:
    a control circuit;
    a first power supply that outputs a first voltage to be supplied to the control circuit as a power-supply voltage;
    a first voltage monitoring circuit that determines whether the first voltage is abnormal;
    a first switch that is coupled to the first power supply and the control circuit, and cuts off supply of the first voltage to the control circuit when it is determined that first voltage is abnormal;
    a power-supply switching circuit that is coupled to the control circuit and a second power supply that outputs a second voltage to be supplied to a circuit to which power supply is supplied other than the control circuit as a power-supply voltage, and supplies the second voltage to the control circuit in a state where the supply of the first voltage to the control circuit is cut off,
    wherein the power-supply switching circuit comprises a clamp circuit that is coupled to the second power supply and the control circuit and clamps the second voltage; and
    a second voltage monitoring circuit that determines whether the second voltage is abnormal,
    wherein the control circuit executes a stop sequence that stops a circuit inside the semiconductor device and outputs an error signal to outside of the semiconductor device, when it is determined that the second voltage is abnormal.

12. A power-supply system comprising:
a first semiconductor device; and
a second semiconductor device,
wherein the second semiconductor device includes a second power supply that outputs a second voltage to be supplied to a circuit inside the second semiconductor device as a power-supply voltage, and
wherein the first semiconductor device includes
a control circuit,
a first power supply that outputs a first voltage to be supplied to the control circuit as a power-supply voltage,
a first voltage monitoring circuit that determines whether the first voltage is abnormal,
a first switch that is coupled to the first power supply and the control circuit, and cuts off supply of the first voltage to the control circuit when it is determined that the first voltage is abnormal, and
a power-supply switching circuit that is coupled to the second power supply and the control circuit, and supplies the second voltage to the control circuit in a state where the supply of the first voltage to the control circuit is cut off, and
wherein the first switch includes a first transistor and a first body-diode of the first transistor, an anode of the first body diode being coupled to the control circuit.

13. The power-supply system according to claim 12, wherein the first semiconductor device further includes a second voltage monitoring circuit that determines whether the second voltage is abnormal, and
wherein the power-supply switching circuit includes
a second switch that is coupled to the second power supply, and cuts off supply of the second voltage to the control circuit when it is determined that the second voltage is abnormal, and
a diode that is coupled to the control circuit at a cathode thereof and to the second switch at an anode thereof.

14. The power-supply system according to claim 12, wherein the power-supply switching circuit comprises a clamp circuit that is coupled to the second power supply and the control circuit and clamps the second voltage.

15. The power-supply system according to claim 14, wherein the first semiconductor device further includes a second voltage monitoring circuit that determines whether the second voltage is abnormal.

16. The power-supply system according to claim 12, wherein the control circuit executes a stop sequence that stops a circuit inside the first semiconductor device and outputs an error signal to the second semiconductor device, when it is determined that the first voltage is abnormal.

17. The power-supply system according to claim 13, wherein the control circuit executes a stop sequence that stops a circuit inside the first semiconductor device and outputs an error signal to the second semiconductor device, when it is determined that the second voltage is abnormal.

18. The power-supply system according to claim 12, wherein the first switch further includes a second transistor coupled to the first transistor and a second body-diode of the second transistor, a cathode of the second body-diode being coupled to a cathode of the first body-diode.

19. The power-supply system according to claim 13, wherein the second switch includes a third transistor and a third body-diode of the third transistor, an anode of the third body-diode being coupled to the anode of the diode.

20. A power-supply system comprising:
a first semiconductor device; and
a second semiconductor device,
wherein the second semiconductor device includes a second power supply that outputs a second voltage to be supplied to a circuit to which power supply is supplied inside the second semiconductor device as a power-supply voltage, and
wherein the first semiconductor device includes
a control circuit,
a first power supply that outputs a first voltage to be supplied to the control circuit as a power-supply voltage,
a first voltage monitoring circuit that determines whether the first voltage is abnormal,
a first switch that is coupled to the first power supply and the control circuit, and cuts off supply of the first voltage to the control circuit when it is determined that the first voltage is abnormal, and
a power-supply switching circuit that is coupled to the second power supply and the control circuit, and supplies the second voltage to the control circuit in a state where the supply of the first voltage to the control circuit is cut off,
wherein the power-supply switching circuit comprises a clamp circuit that is coupled to the second power supply and the control circuit and clamps the second voltage,
wherein the first semiconductor device further includes a second voltage monitoring circuit that determines whether the second voltage is abnormal, and
wherein the control circuit executes a stop sequence that stops a circuit inside the first semiconductor device and outputs an error signal to the second semiconductor device, when it is determined that the second voltage is abnormal.

* * * * *